(12) United States Patent
Ootera et al.

(10) Patent No.: US 10,354,739 B2
(45) Date of Patent: Jul. 16, 2019

(54) MAGNETIC MEMORY DEVICE INCLUDING MAGNETIC PORTIONS NONMAGNETIC LAYERS

(71) Applicant: Toshiba Memory Corporation, Tokyo (JP)

(72) Inventors: Yasuaki Ootera, Yokohama Kanagawa (JP); Tsuyoshi Kondo, Kawasaki Kanagawa (JP); Nobuyuki Umetsu, Kawasaki Kanagawa (JP); Michael Arnaud Quinsat, Yokohama Kanagawa (JP); Takuya Shimada, Kawasaki Kanagawa (JP); Masaki Kado, Kamakura Kanagawa (JP); Susumu Hashimoto, Nerima Tokyo (JP); Shiho Nakamura, Fujisawa Kanagawa (JP); Hideaki Aochi, Yokkaichi Mie (JP); Tomoya Sanuki, Suzuka Mie (JP); Shinji Miyano, Yokohama Kanagawa (JP); Yoshihiro Ueda, Yokohama Kanagawa (JP); Yuichi Ito, Yokkaichi Mie (JP); Yasuhito Yoshimizu, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/919,710

(22) Filed: Mar. 13, 2018

(65) Prior Publication Data

US 2019/0088346 A1    Mar. 21, 2019

(30) Foreign Application Priority Data

Sep. 15, 2017  (JP) .................................. 2017-178204

(51) Int. Cl.
*H01L 43/08* (2006.01)
*G11C 19/08* (2006.01)
(Continued)

(52) U.S. Cl.
CPC ........ *G11C 19/0841* (2013.01); *H01L 27/228* (2013.01); *H01L 43/08* (2013.01); *H01L 43/10* (2013.01)

(58) Field of Classification Search
CPC . G11C 19/0841; G11C 19/0866; H01L 43/08; H01L 43/10; H01L 27/228
See application file for complete search history.

(56) References Cited

U.S. PATENT DOCUMENTS 9,841,444 B2 * 12/2017 Fukuzawa .......... G01R 19/0092
2006/0237808 A1 * 10/2006 Saito .................... G11C 11/16
257/421
(Continued)

FOREIGN PATENT DOCUMENTS

JP   2015-173145 A   10/2015
JP   2016-9806 A   1/2016

*Primary Examiner* — Harry W Byrne
*Assistant Examiner* — Sultana Begum
(74) *Attorney, Agent, or Firm* — Finnegan, Henderson, Farabow, Garrett & Dunner, L.L.P.

(57) ABSTRACT

According to one embodiment, a magnetic memory device includes a first magnetic portion, a first magnetic layer, a first nonmagnetic layer, a second magnetic portion, a second magnetic layer, a second nonmagnetic layer, a first electrode, and a second electrode. The first magnetic portion includes a first magnetic part and a second magnetic part. The first nonmagnetic layer is provided between the first magnetic layer and the first magnetic part. The second magnetic portion includes a third magnetic part and a fourth magnetic part. The second nonmagnetic layer is provided between the second magnetic layer and the third magnetic part. The first electrode electrically is connected to the second magnetic
(Continued)

part and the fourth magnetic part. The second electrode is electrically connected to the first magnetic part and the third magnetic part.

30 Claims, 16 Drawing Sheets

(51) Int. Cl.
*H01L 27/22* (2006.01)
*H01L 43/10* (2006.01)

(56) References Cited

U.S. PATENT DOCUMENTS

| | | | |
|---|---|---|---|
| 2015/0078070 A1* | 3/2015 | Quinsat | H01L 27/228 365/158 |
| 2015/0262702 A1 | 9/2015 | Ootera et al. | |
| 2015/0380638 A1 | 12/2015 | Ootera et al. | |
| 2018/0268888 A1* | 9/2018 | Ohsawa | G11C 11/165 |

\* cited by examiner

MAGNETIC MEMORY DEVICE INCLUDING MAGNETIC PORTIONS NONMAGNETIC LAYERS

CROSS-REFERENCE TO RELATED APPLICATIONS

This application is based upon and claims the benefit of priority from Japanese Patent Application No. 2017-178204, filed on Sep. 15, 2017; the entire contents of which are incorporated herein by reference.

FIELD

Embodiments described herein relate generally to a magnetic memory device.

BACKGROUND

There is a magnetic memory device that includes a magnetic portion. It is desirable for the magnetic memory device to be small.

DETAILED DESCRIPTION

Figure 1:
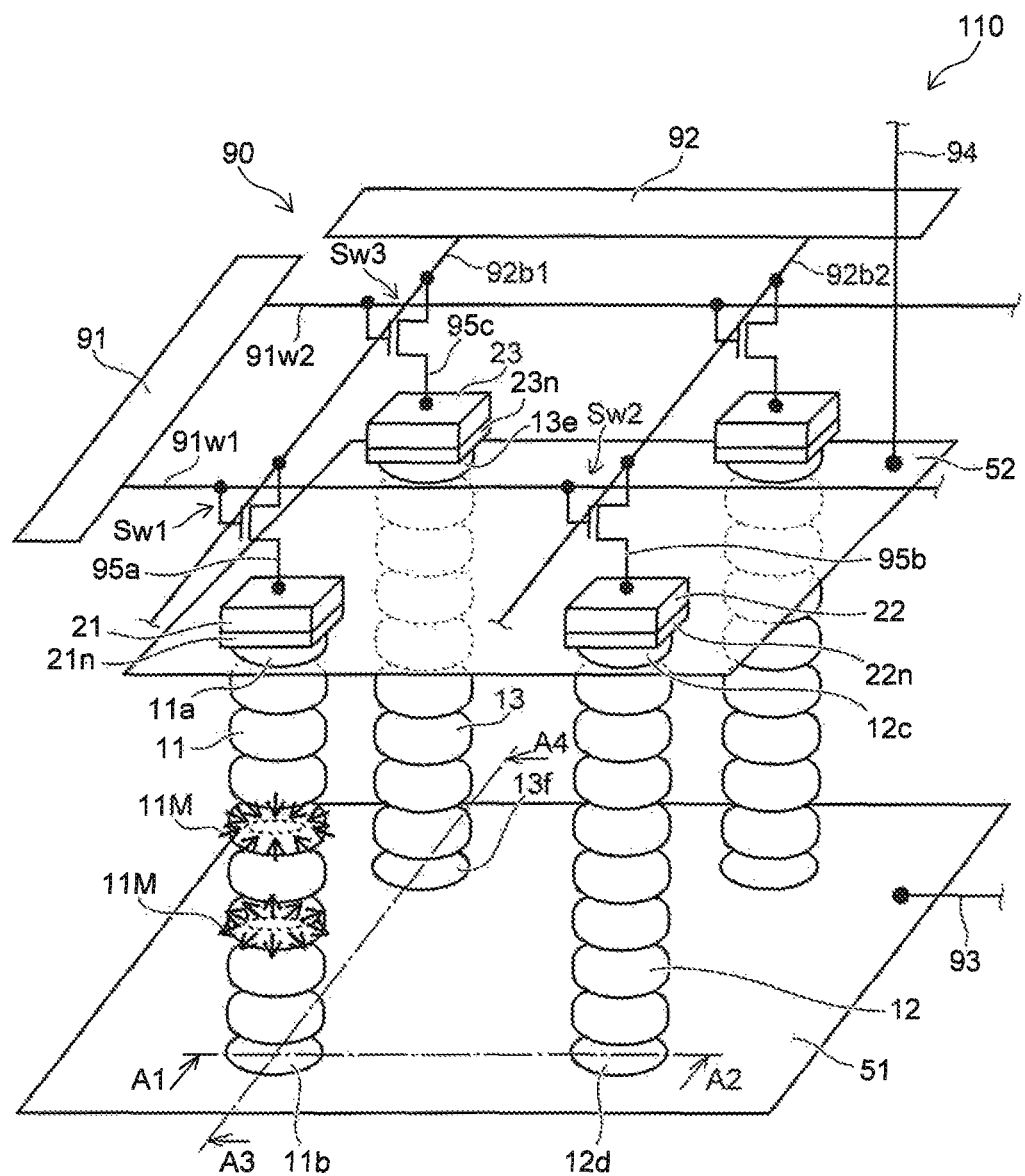
FIG. 1 is a schematic perspective view illustrating a magnetic memory device according to a first embodiment.

According to one embodiment, a magnetic memory device includes a first magnetic portion, a first magnetic layer, a first nonmagnetic layer, a second magnetic portion, a second magnetic layer, a second nonmagnetic layer, a first electrode, and a second electrode. The first magnetic portion includes a first magnetic part and a second magnetic part. The first nonmagnetic layer is provided between the first magnetic layer and the first magnetic part. The second magnetic portion includes a third magnetic part and a fourth magnetic part. The second nonmagnetic layer is provided between the second magnetic layer and the third magnetic part. The first electrode electrically is connected to the second magnetic part and the fourth magnetic part. The second electrode is electrically connected to the first magnetic part and the third magnetic part.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

FIG. 1 is a schematic perspective view illustrating a magnetic memory device according to a first embodiment.

As illustrated in FIG. 1, the magnetic memory device 110 includes a first magnetic portion 11, a second magnetic portion 12, a third magnetic portion 13, a first magnetic layer 21, a second magnetic layer 22, a third magnetic layer 23, a first nonmagnetic layer 21$n$, a second nonmagnetic layer 22$n$, a third nonmagnetic layer 23$n$, a first electrode 51, a second electrode 52, and a controller 90.

The first magnetic portion 11 includes a first magnetic part 11$a$ and a second magnetic part 11$b$. The first nonmagnetic layer 21$n$ is provided between the first magnetic part 11$a$ and the first magnetic layer 21. For example, the direction from the second magnetic part 11$b$ toward the first magnetic part 11$a$ is aligned with a first direction.

For example, the first direction is aligned with a Z-axis direction illustrated in FIG. 1. One direction perpendicular to the Z-axis direction is taken as an X-axis direction. A direction perpendicular to the X-axis direction and the Z-axis direction is taken as a Y-axis direction. A direction that crosses the first direction is taken as a second direction. For example, the second direction is aligned with the X-axis direction. A direction that crosses the first direction and the second direction is taken as a third direction. For example, the third direction is aligned with the Y-axis direction.

The case will now be described where the first direction, the second direction, and the third direction are aligned respectively with the X-axis direction, the Z-axis direction, and the Y-axis direction.

The second magnetic portion 12 is separated from the first magnetic portion 11 in the X-axis direction. The second magnetic portion 12 includes a third magnetic part 12$c$ and a fourth magnetic part 12$d$. The second nonmagnetic layer 22$n$ is provided between the third magnetic part 12$c$ and the second magnetic layer 22. For example, the direction from the fourth magnetic part 12$d$ toward the third magnetic part 12$c$ is aligned with the Z-axis direction.

The third magnetic portion 13 is separated from the first magnetic portion 11 in the Y-axis direction. The third magnetic portion 13 includes a fifth magnetic part 13$e$ and a sixth magnetic part 13$f$. The third nonmagnetic layer 23$n$ is provided between the fifth magnetic part 13$e$ and the third magnetic layer 23. For example, the direction from the sixth magnetic part 13$f$ toward the fifth magnetic part 13$e$ is aligned with the Z-axis direction.

The first electrode 51 is electrically connected to the second magnetic part 11$b$, the fourth magnetic part 12$d$, and the sixth magnetic part 13$f$. For example, the potential of the second magnetic part 11$b$ is the same as the potential of the fourth magnetic part 12$d$ and the same as the potential of the sixth magnetic part 13f. For example, the first electrode 51 is aligned with the X-axis direction and the Y-axis direction.

The second electrode 52 is separated from the first electrode 51 in the Z-axis direction. The second electrode 52 is electrically connected to the first magnetic part 11a, the third magnetic part 12c, and the fifth magnetic part 13e. For example, the potential of the first magnetic part 11a is the same as the potential of the third magnetic part 12c and the same as the potential of the fifth magnetic part 13e. For example, the second electrode 52 is aligned with the X-axis direction and the Y-axis direction. For example, the position in the Z-axis direction of the second electrode 52 is between the position in the Z-axis direction of the first magnetic layer 21 and the position in the Z-axis direction of the first electrode 51.

The first electrode 51 is electrically connected to an interconnect 93. The second electrode 52 is electrically connected to an interconnect 94. The first magnetic layer 21 is electrically connected to an interconnect 95a. The second magnetic layer 22 is electrically connected to an interconnect 95b. The third magnetic layer 23 is electrically connected to an interconnect 95c.

For example, the controller 90 is electrically connected to the interconnect 93, the interconnect 94, and the interconnects 95a to 95c. The controller 90 includes, for example, a first selector 91 and a second selector 92. The first selector 91 is electrically connected to multiple word lines including a first word line 91w1 and a second word line 91w2. The second selector 92 is electrically connected to multiple bit lines including a first bit line 92b1 and a second bit line 92b2.

In the example illustrated in FIG. 1, a gate terminal of a first switch element Sw1 and a gate terminal of a second switch element Sw2 are electrically connected to the first word line 91w1. A gate terminal of a third switch element Sw3 is electrically connected to the second word line 91w2. One terminal of the first switch element Sw1 and one terminal of the third switch element Sw3 are electrically connected to the first bit line 92b1. One terminal of the second switch element Sw2 is electrically connected to the second bit line 92b2. Another one terminal of the first switch element Sw1 is electrically connected to the first magnetic layer 21 via the interconnect 95a. Another one terminal of the second switch element Sw2 is electrically connected to the second magnetic layer 22 via the interconnect 95b. Another one terminal of the third switch element Sw3 is electrically connected to the third magnetic layer 23 via the interconnect 95c.

Figure 2A:
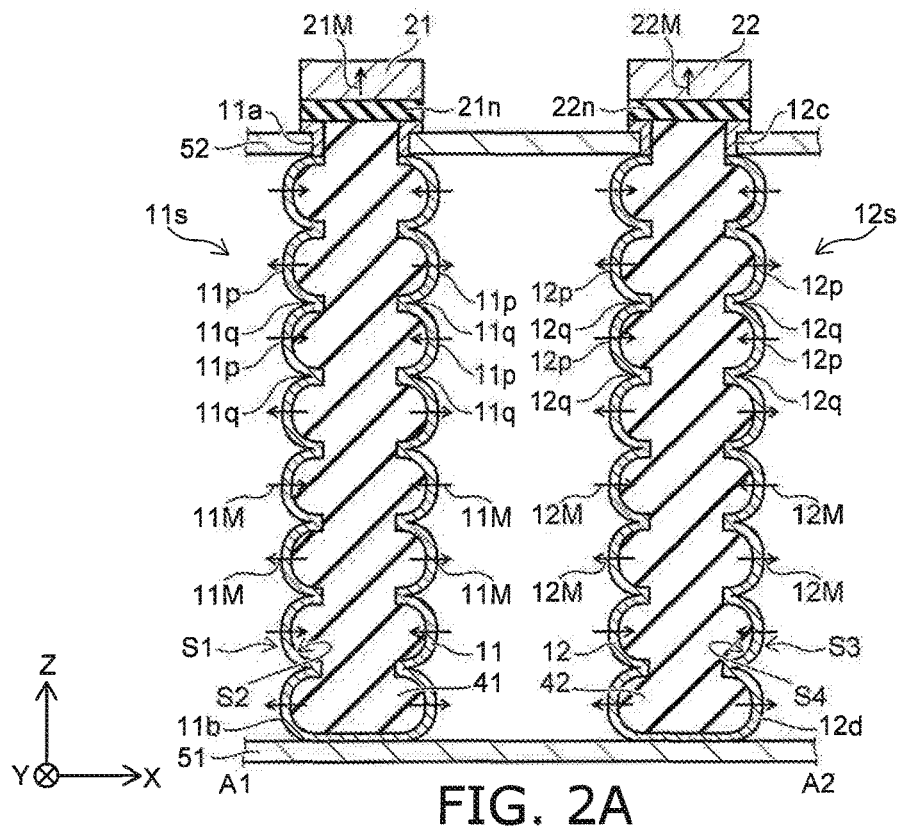
FIG. 2A is an X-Z cross-sectional view including line A1-A2 of FIG. 1
Figure 2B:
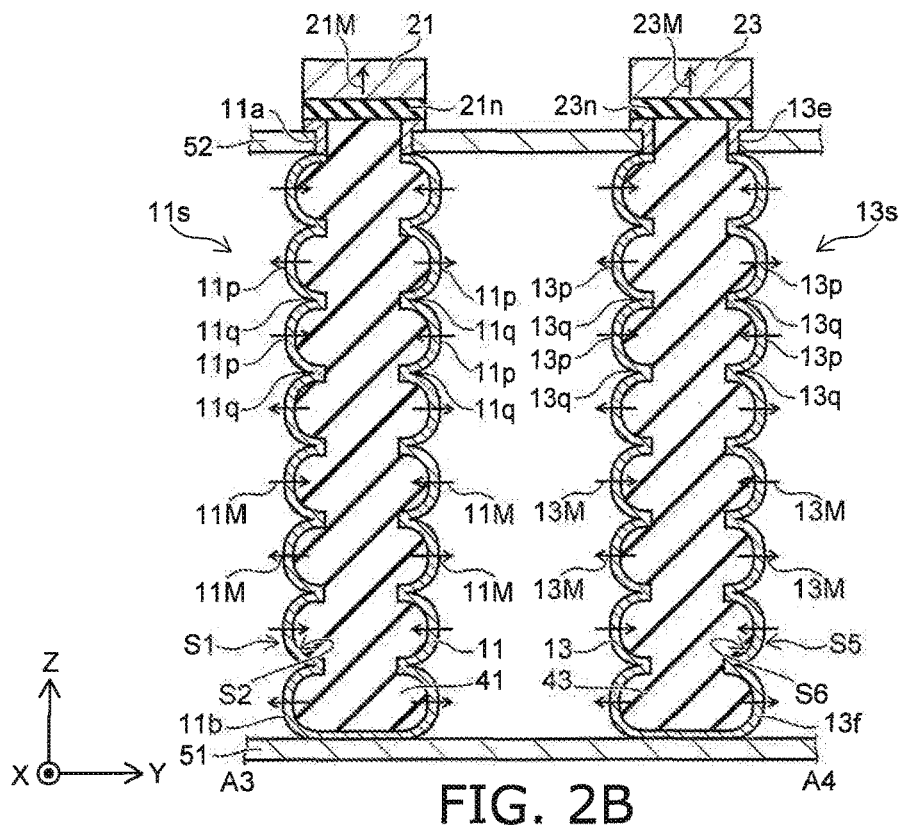
FIG. 2B is a Y-Z cross-sectional view including line A3-A4 of FIG. 1.

FIG. 2A is an X-Z cross-sectional view including line A1-A2 of FIG. 1. FIG. 2B is a Y-Z cross-sectional view including line A3-A4 of FIG. 1.

In the example, the first magnetic portion 11, the second magnetic portion 12, and the third magnetic portion 13 have pipe configurations.

As illustrated in FIG. 2A, for example, the first magnetic portion 11 is provided around a first insulating portion 41. The direction from the first insulating portion 41 toward the first magnetic portion 11 crosses the Z-axis direction. The first magnetic portion 11 includes, for example, multiple magnetic domains arranged in the Z-axis direction. For example, the orientation of a first magnetization 11M of the magnetic domain crosses the Z-axis direction.

In the example, the first magnetic portion 11 includes a first structure portion 11s. The first structure portion 11s has a first surface S1 and a second surface S2. The second surface S2 is positioned between the first insulating portion 41 and the first surface S1.

The first surface S1 includes multiple unevennesses arranged in the Z-axis direction. The multiple unevennesses are portions (unevennesses) in the first surface S1 having different heights along the second direction crossing the first direction. For example, the first surface S1 includes multiple first top portions 11p and multiple first bottom portions 11q. Each of the multiple first top portions 11p corresponds to a protrusion of the first surface S1 in a direction crossing the Z-axis direction. Each of the multiple first bottom portions 11q corresponds to a recess of the first surface S1 in the direction crossing the Z-axis direction. The multiple first top portions 11p and the multiple first bottom portions 11q are provided alternately in the Z-axis direction.

For example, the first magnetic portion 11 has an axis extending in the Z-axis direction. For example, the axis passes through the center of the first magnetic portion 11. The unevennesses of the first surface S1 correspond to a repeating increase and decrease of the distance along the X-axis direction or the Y-axis direction between the first surface S1 and the axis recited above. The distance between the first surface S1 and the axis recited above is a maximum at the multiple first top portions 11p. The distance between the first surface S1 and the axis recited above is a minimum at the multiple first bottom portions 11q.

For example, the second magnetic portion 12 is provided around a second insulating portion 42. The direction from the second insulating portion 42 toward the second magnetic portion 12 crosses the Z-axis direction. The second magnetic portion 12 includes, for example, multiple magnetic domains arranged in the Z-axis direction. For example, the orientation of a second magnetization 12M of the magnetic domain crosses the Z-axis direction.

In the example, the second magnetic portion 12 includes a second structure portion 12s. The second structure portion 12s has a third surface S3 and a fourth surface S4. The fourth surface S4 is positioned between the second insulating portion 42 and the third surface S3. Similarly to the first surface S1, the third surface S3 includes multiple second top portions 12p and multiple second bottom portions 12q that are arranged alternately in the Z-axis direction.

For example, the third magnetic portion 13 is provided around a third insulating portion 43. The direction from the third insulating portion 43 toward the third magnetic portion 13 crosses the Z-axis direction. The third magnetic portion 13 includes, for example, multiple magnetic domains arranged in the Z-axis direction. For example, the orientation of a third magnetization 13M of the magnetic domain crosses the Z-axis direction.

In the example, the third magnetic portion 13 includes a third structure portion 13s. The third structure portion 13s has a surface S5 and a surface S6. The surface S6 is positioned between the third insulating portion 43 and the surface S5. Similarly to the first surface S1, the surface S5 includes multiple third top portions 13p and multiple third bottom portions 13q arranged alternately in the Z-axis direction.

FIG. 3A, FIG. 3B, FIG. 4A, FIG. 4B, and FIG. 5 are schematic views illustrating operations of the magnetic memory device according to the first embodiment.

The potential of the interconnect 93 is taken as a potential V1. The potential of the interconnect 94 is taken as a potential V2. The potential of the interconnect 95a is taken as a potential V3a. The potential of the interconnect 95b is taken as a potential V3b. The potential of the interconnect 95c is taken as a potential V3c. The potential V1 is, for example, a ground potential.

Figure 3A:
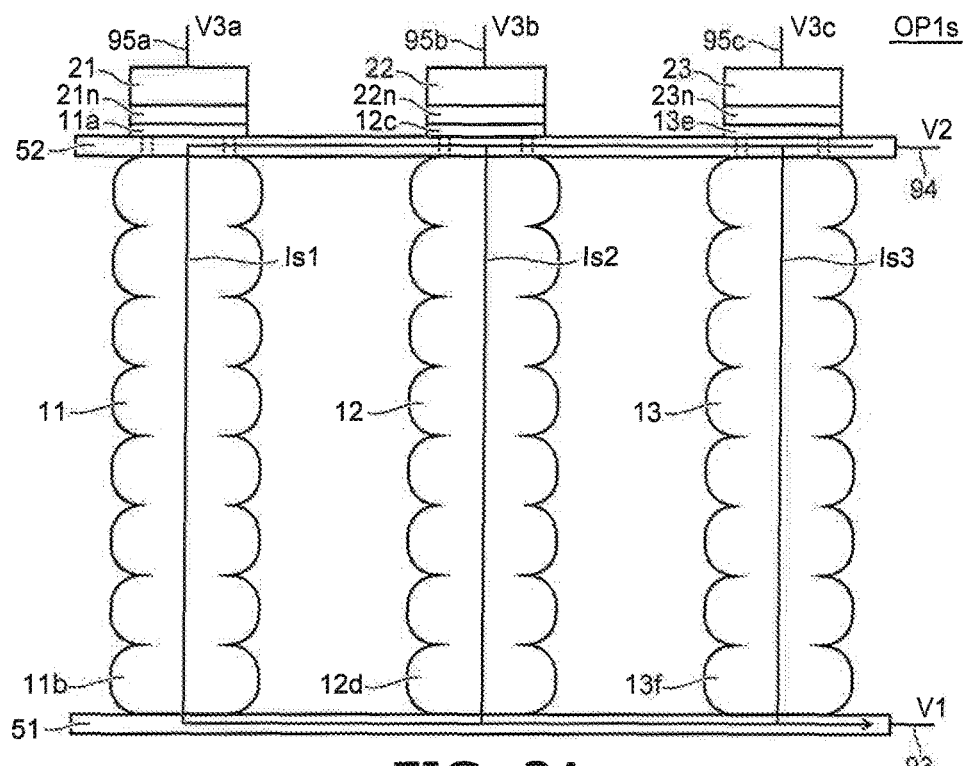
FIG. 3A, FIG. 3B, FIG. 4A, FIG. 4B, and FIG. 5 are schematic views illustrating operations of the magnetic memory device according to the first embodiment.
Figure 3B:
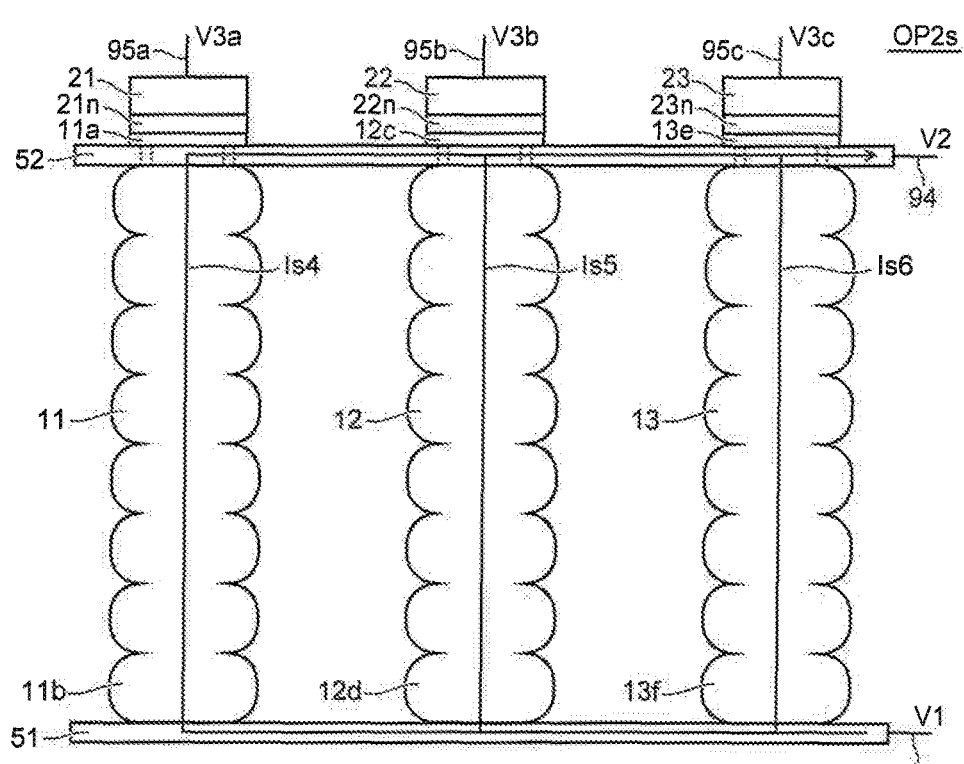

As illustrated in FIG. 3A and FIG. 3B, the controller 90 performs a first shift operation OP1s and a second shift operation OP2s.

In the first shift operation OP1s, the controller 90 sets the potential V2 to be higher than the potential V1. Thereby, as illustrated in FIG. 3A, a current Is1 that flows through the first magnetic portion 11, a current Is2 that flows through the second magnetic portion 12, and a current Is3 that flows through the third magnetic portion 13 are supplied from the second electrode 52 toward the first electrode 51. Thereby, the multiple magnetic domains that are included in the first magnetic portion 11, the multiple magnetic domains that are included in the second magnetic portion 12, and the multiple magnetic domains that are included in the third magnetic portion 13 are moved. For example, the orientation in which these magnetic domains move is dependent on the orientation of the current and the materials included in each magnetic part.

In the second shift operation OP2s, the controller 90 sets the potential V2 to be lower than the potential V1. Thereby, as illustrated in FIG. 3B, a current Is4 in the first magnetic portion 11, a current Is5 in the second magnetic portion 12, and a current Is6 in the third magnetic portion 13 are supplied from the first electrode 51 toward the second electrode 52. Thereby, the multiple magnetic domains that are included in the first magnetic portion 11, the multiple magnetic domains that are included in the second magnetic portion 12, and the multiple magnetic domains that are included in the third magnetic portion 13 are moved. The orientation in which the multiple magnetic domains move in the second shift operation OP2s is the reverse of the orientation in which the multiple magnetic domains move in the first shift operation OP1s.

For example, the potentials V3a to V3c are floating in the first shift operation OP1s and the second shift operation OP2s.

Figure 4A:
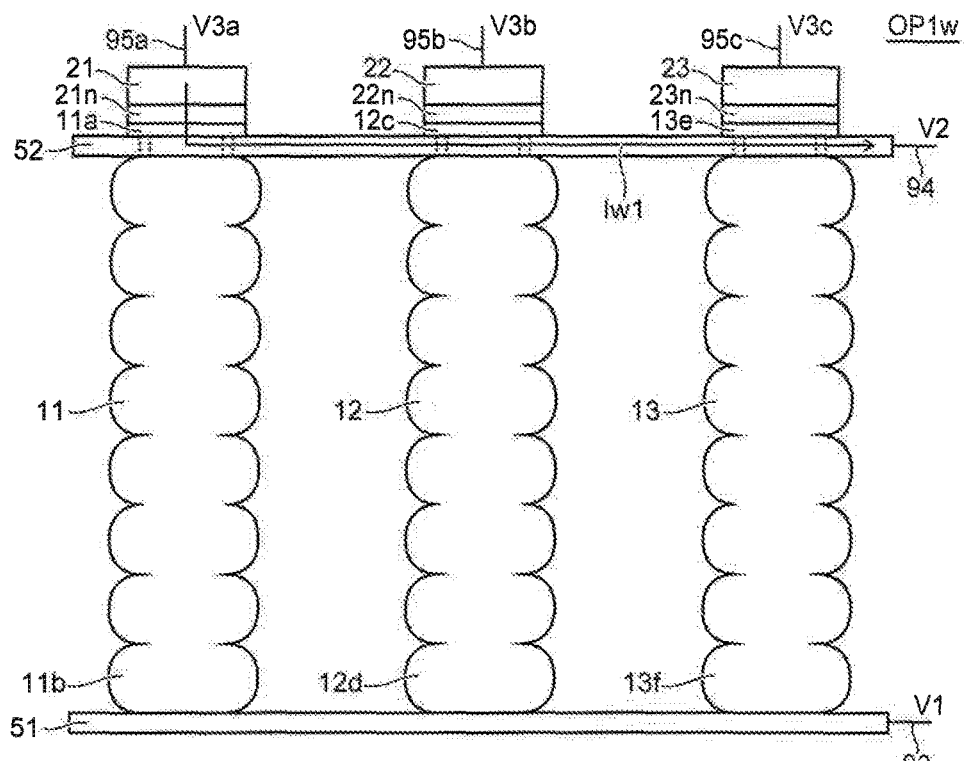
Figure 4B:
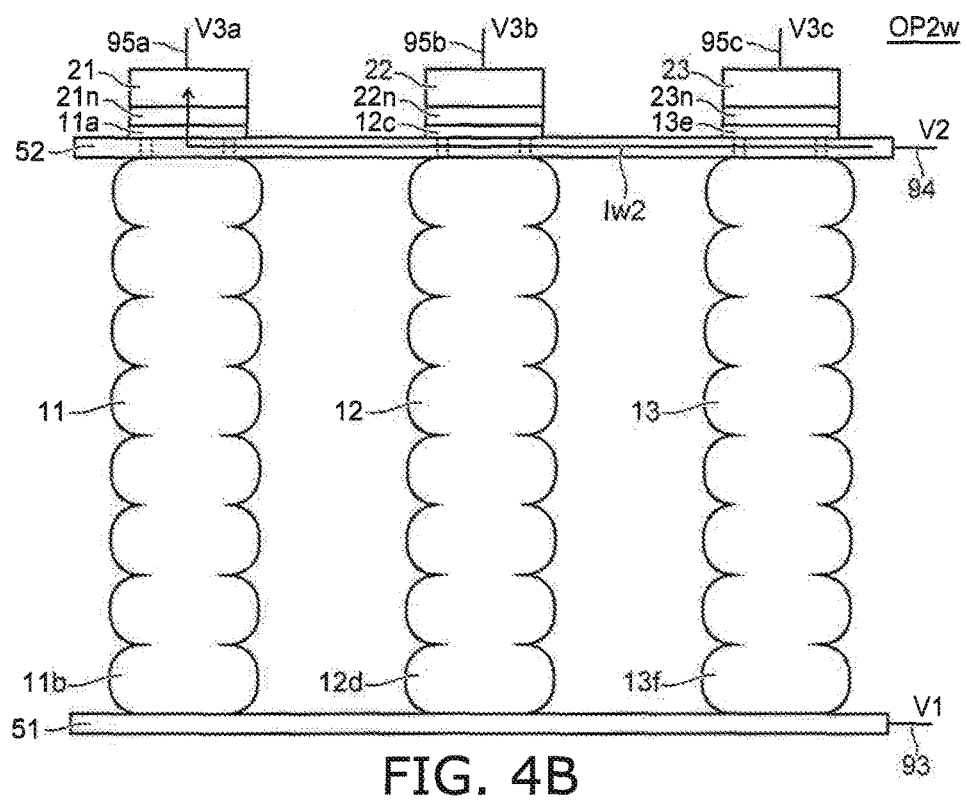

As illustrated in FIG. 4A and FIG. 4B, the controller 90 performs a first write operation OP1w and a second write operation OP2w.

For example, in the first write operation OP1w, the controller 90 sets one of the potential V3a, the potential V3b, or the potential V3c to be higher than the potential V2. For example, the controller 90 sets the potential V3a to be higher than the potential V2. The difference between the potential V3a and the potential V2 is larger than the difference between the potential V3b and the potential V2 and larger than the difference between the potential V3c and the potential V2. For example, the potential V2 is set to be lower than the potential V1. The difference between the potential V1 and the potential V2 is smaller than the difference between the potential V1 and the potential V3a. Thereby, as illustrated in FIG. 4A, a current Iw1 that flows from the first magnetic layer 21 toward the second electrode 52 is supplied. After performing the first write operation OP1w, for example, the orientation of the magnetization of the first magnetic part 11a is aligned with the orientation of the magnetization of the first magnetic layer 21.

For example, in the second write operation OP2w, the controller 90 sets one of the potential V3a, the potential V3b, or the potential V3c to be lower than the potential V2. For example, the controller 90 sets the potential V3a of the first magnetic layer 21 to be lower than the potential V2. The difference between the potential V3a and the potential V2 is larger than the difference between the potential V3b and the potential V2 and larger than the difference between the potential V3c and the potential V2. For example, the potential V2 is set to be higher than the potential V1. For example, the difference between the potential V1 and the potential V2 is smaller than the difference between the potential V1 and the potential V3a. Thereby, as illustrated in FIG. 4A, a current Iw2 that flows from the second electrode 52 toward the first magnetic layer 21 is supplied. After performing the second write operation OP2w, the orientation of the magnetization of the first magnetic part 11a is, for example, the reverse of the orientation of the magnetization of the first magnetic layer 21. The orientation of the magnetization of the first magnetic part 11a after performing the second write operation OP2w is aligned with the reverse orientation of the orientation of the magnetization of the first magnetic part 11a after performing the first write operation OP1w.

In the example recited above, the magnetization information is written to the first magnetic part 11a by performing the first write operation OP1w or the second write operation OP2w. In the example recited above, for example, the potential V3b and the potential V3c are floating in the first write operation OP1w and the second write operation OP2w.

Figure 5:
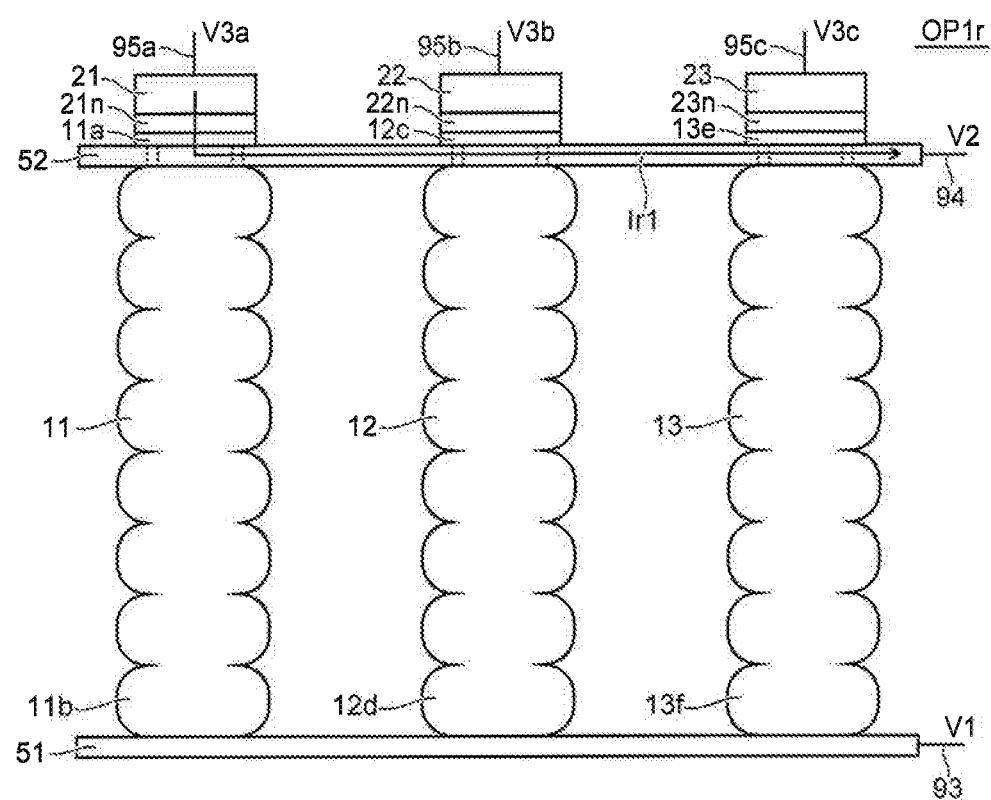

As illustrated in FIG. 5, the controller 90 performs a read operation OP1r.

For example, in the read operation OP1r, the controller 90 sets one of the potentials V3a to V3c to be higher than the potential V2. For example, the controller 90 sets the potential V3a to be higher than the potential V2. The difference between the potential V3a and the potential V2 is larger than the difference between the potential V3b and the potential V2 and larger than the difference between the potential V3c and the potential V2. The potential V2 is higher than the potential V1. Thereby, as illustrated in FIG. 5, a current Ir1 from the first magnetic layer 21 toward the second electrode 52 is supplied.

The difference between the potential V1 and the potential V2 in the read operation OP1r is smaller than the difference between the potential V1 and the potential V2 in the first shift operation OP1s and smaller than the difference between the potential V1 and the potential V2 in the second shift operation OP2s. Thereby, the movement of the multiple magnetic domains in the read operation OP1r can be suppressed.

The difference between the potential V2 and the potential V3a in the read operation OP1r is smaller than the difference between the potential V2 and the potential V3a in the first write operation OP1w and smaller than the difference between the potential V2 and the potential V3a in the second write operation OP2w. Thereby, the change of the orientation of the magnetization of the first magnetic part 11a in the read operation OP1r can be suppressed.

The electrical resistance between the first magnetic layer 21 and the first magnetic part 11a is dependent on the angle between the orientation of the magnetization of the first magnetic layer 21 and the orientation of the magnetization of the first magnetic part 11a. The electrical resistance between the first magnetic layer 21 and the first magnetic part 11a increases as the angle recited above increases. For example, a second electrical resistance between the first magnetic, layer 21 and the first magnetic part 11a after performing the second write operation OP2w is higher than a first electrical resistance between the first magnetic layer 21 and the first magnetic part 11a after performing the first write operation OP1w. For example, the first electrical resistance corresponds to the information of "0;" and the second electrical resistance corresponds to the information of "1."

The controller 90 supplies the current Ir1 and senses the electrical resistance between the first magnetic layer 21 and the first magnetic part 11a. Or, a value (a current value or a voltage value) that corresponds to the electrical resistance is sensed.

According to the embodiment, the number of interconnects, switch elements, etc., connected to the multiple magnetic portions and the multiple electrodes can be reduced. For example, the semiconductor memory device can be downsized. For example, the density of the magnetic parts in the semiconductor memory device can be increased.

The first magnetic portion 11, the second magnetic portion 12, and the third magnetic portion 13 include, for example, perpendicular magnetization films. The first magnetic portion 11, the second magnetic portion 12, and the third magnetic portion 13 may include, for example, a rare earth-transition metal amorphous alloy. The rare earth-transition metal amorphous alloy includes, for example, an alloy including a rare earth-transition metal and a $3d$ transition metal. The rare earth-transition metal amorphous alloy is, for example, a ferrimagnet. The rare earth-transition metal amorphous alloy includes, for example, at least one transition metal and at least one selected from the group consisting of Tb (terbium), Dy (dysprosium), and Gd (gadolinium). The rare earth-transition metal amorphous alloy includes, for example, at least one selected from the group consisting of TbFe, TbCo, TbFeCo, DyTbFeCo, GdTbCo, and GdFeCo.

The first magnetic portion 11, the second magnetic portion 12, and the third magnetic portion 13 may include, for example, multilayer films. The first magnetic portion 11, the second magnetic portion 12, and the third magnetic portion 13 include, for example, at least one selected from the group consisting of a multilayer film including a Co film and a Ni film, a multilayer film including a Co film and a Pd film, and a multilayer film including a Co film and a Pt film.

The first magnetic portion 11, the second magnetic portion 12, and the third magnetic portion 13 may include, for example, an ordered alloy. The ordered alloy includes, for example, at least one selected from the group consisting of Fe, Co, and Ni, and at least one selected from the group consisting of Pt and Pd. The crystal structure of the ordered alloy is, for example, the $L_{10}$-type. The ordered alloy may include, for example, at least one selected from the group consisting of $Co_{50}Pd_{50}$, $Co_{50}Pt_{50}$, $Fe_{50}Pt_{50}$, $Fe_{50}Pd_{50}$, $Fe_{30}Ni_{20}Pd_{50}$, $Co_{30}Fe_{10}Ni_{10}Pt_{50}$, and $Co_{30}Ni_{20}Pt_{50}$. The composition ratio of the ordered alloy is not limited to those recited above.

The first magnetic portion 11, the second magnetic portion 12, and the third magnetic portion 13 may include an ordered alloy and another element. The other element includes, for example, at least one selected from the group consisting of V, Mn, Cu, Cr, and Ag. For example, the magnetic anisotropy energy or the saturation magnetization may be adjusted by adding these elements. For example, a large magnetic anisotropy energy is obtained.

The first magnetic layer 21, the second magnetic layer 22, and the third magnetic layer 23 include, for example, at least one selected from the group consisting of Fe, Co, and Ni. The first magnetic layer 21, the second magnetic layer 22, and the third magnetic layer 23 may include, for example, an alloy including at least one selected from the group consisting of Fe, Co, and Ni. The first magnetic layer 21, the second magnetic layer 22, and the third magnetic layer 23 may further include, for example, another element (e.g., a semimetal). The other element includes, for example, at least one selected from the group consisting of boron and silicon. The first magnetic layer 21, the second magnetic layer 22, and the third magnetic layer 23 may include, for example, multilayer films. The multilayer film includes a first film and a second film. The first film includes, for example, at least one selected from the group consisting of Fe, Co, and Ni. The second film includes a platinum group metal (e.g., Pt, Pd, etc.). The first magnetic layer 21, the second magnetic layer 22, and the third magnetic layer 23 include, for example, a multilayer film including a Ni film and a film of a Co—Fe alloy (a Co—Fe/Ni multilayer film).

The first electrode 51, the second electrode 52, and a third electrode 53 include, for example, at least one selected from the group consisting of Cu, Ag, Au, and Al. At least one of these electrodes may include an alloy including at least one of these elements.

The first nonmagnetic layer 21n, the second nonmagnetic layer 22n, and the third nonmagnetic layer 23n include, for example, at least one selected from the group consisting of aluminum oxide ($AlO_x$), aluminum nitride (AlN), magnesium oxide (MgO), magnesium nitride, silicon oxide ($SiO_2$), silicon nitride (Si—N), silicon oxynitride (Si—O—N), titanium oxide ($TiO_2$), and chromium oxide ($Cr_2O_3$). These materials function as, for example, a nonmagnetic tunneling barrier. The first nonmagnetic layer 21n, the second nonmagnetic layer 22n, and the third nonmagnetic layer 23n may include, for example, a nonmagnetic metal. For example, the spin torque is transferred effectively by the appropriate material (and thickness) of the first nonmagnetic layer 21n, the second nonmagnetic layer 22n, and the third nonmagnetic layer 23n.

Figure 6:
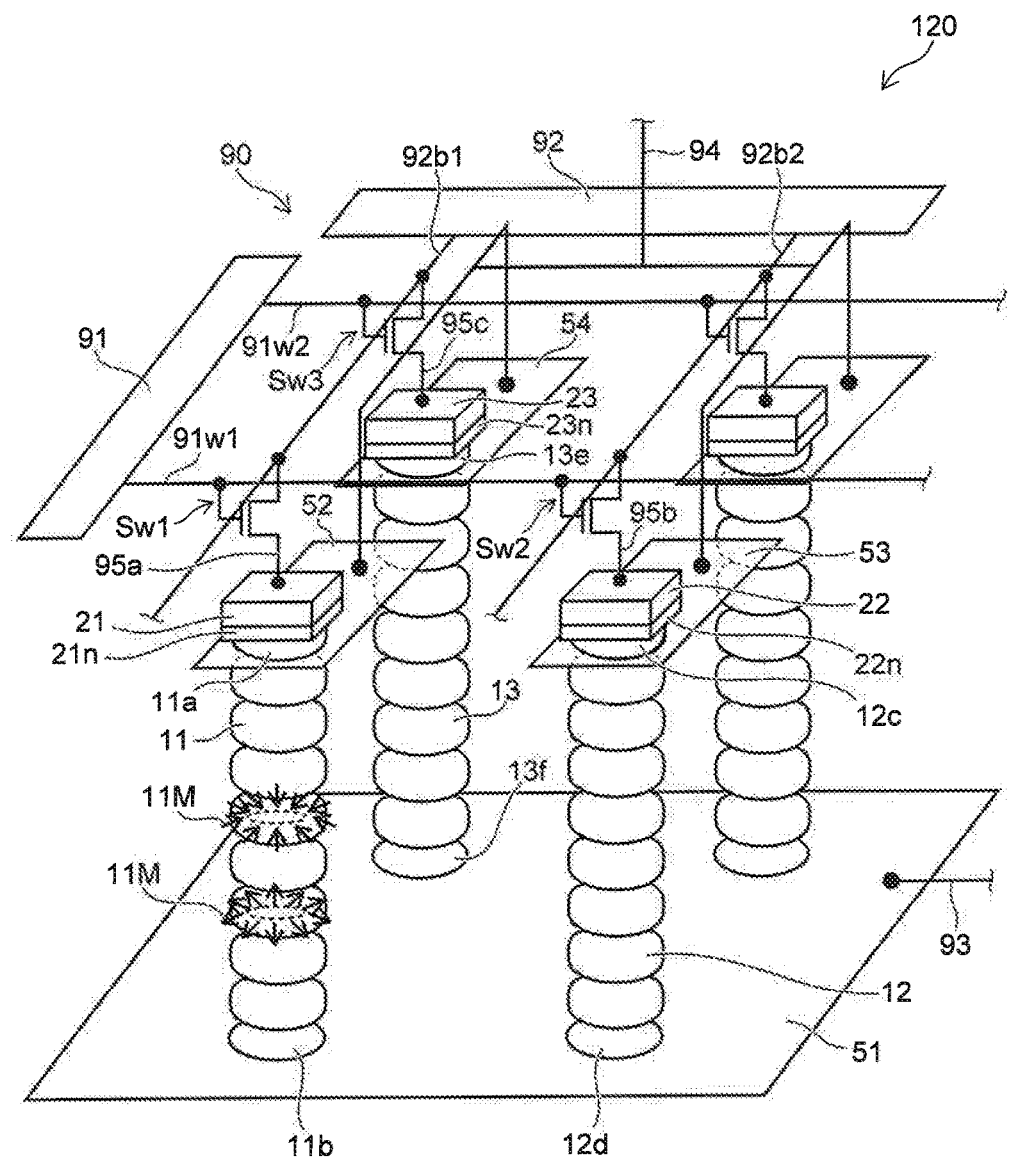
FIG. 6 is a schematic perspective view illustrating another magnetic memory device according to the first embodiment.

FIG. 6 is a schematic perspective view illustrating another magnetic memory device according to the first embodiment.

The magnetic memory device 120 illustrated in FIG. 6 includes, for example, the second electrode 52, the third electrode 53, and a fourth electrode 54.

The second electrode 52 is electrically connected to the first magnetic part 11a. The third electrode 53 is electrically connected to the third magnetic part 12c. The fourth electrode 54 is electrically connected to the fifth magnetic part 13e. The second electrode 52, the third electrode 53, and the fourth electrode 54 are separated from each other. The second electrode 52, the third electrode 53, and the fourth electrode 54 are electrically connected to the interconnect 94. For example, the potential of the second electrode 52 is the same as the potential of the third electrode 53 and the same as the potential of the fourth electrode 54.

Similarly to the operations of the magnetic memory device 110 illustrated in FIG. 3A, FIG. 3B, FIG. 4A, FIG. 4B, and FIG. 5, the magnetic memory device 120 can perform the first shift operation OP1s, the second shift operation OP2s, the first write operation OP1w, the second write operation OP2w, and the read operation OP1r.

Figure 7:
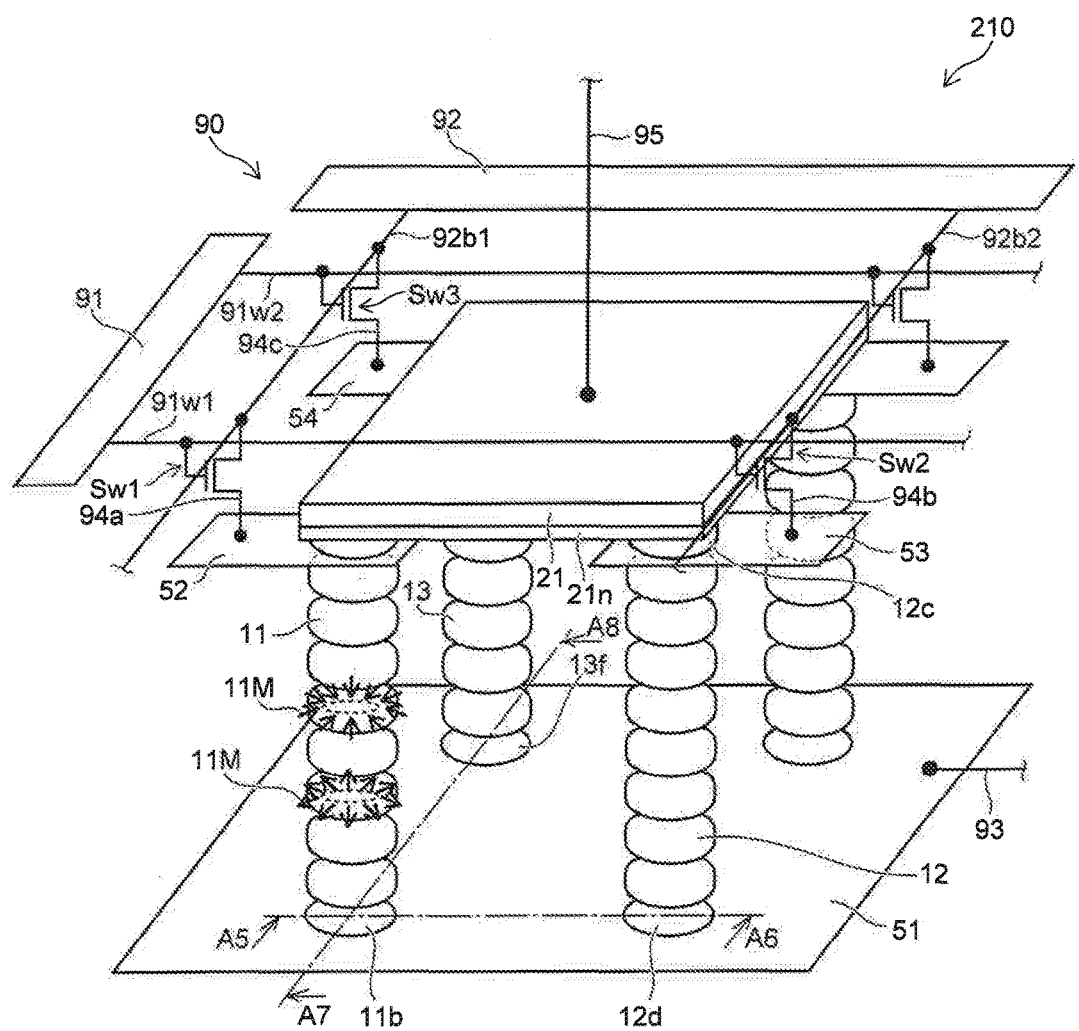
FIG. 7 is a schematic perspective view illustrating a magnetic memory device according to a second embodiment.

FIG. 7 is a schematic perspective view illustrating a magnetic memory device according to a second embodiment.

Figure 8A:
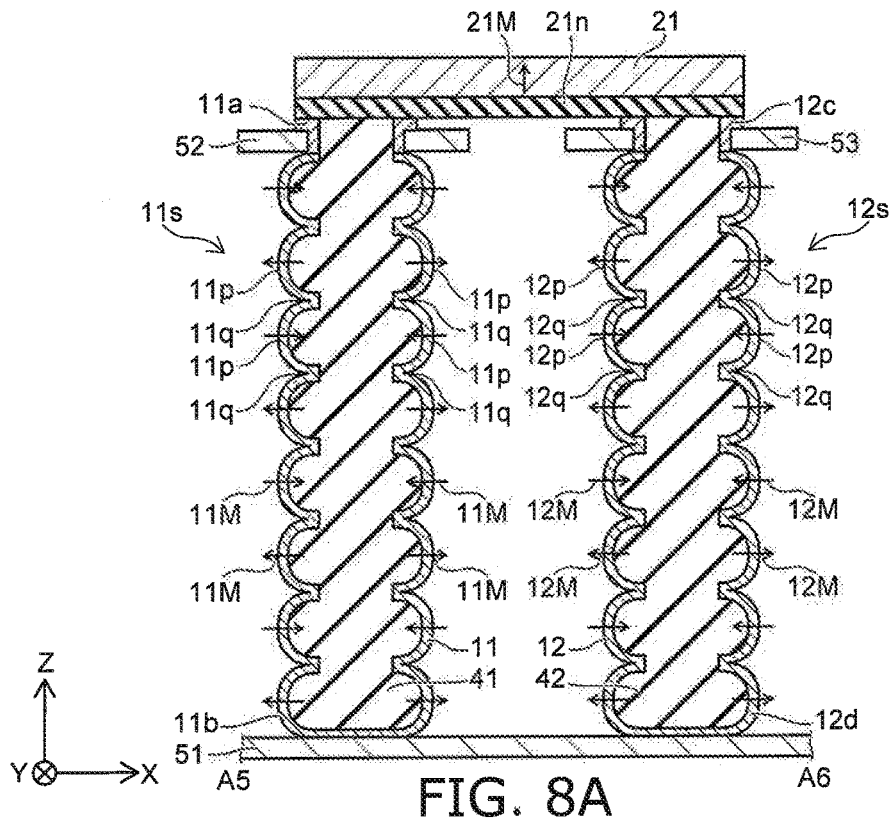
FIG. 8A and FIG. 8B are schematic cross-sectional views illustrating the magnetic memory device according to the second embodiment.
Figure 8B:
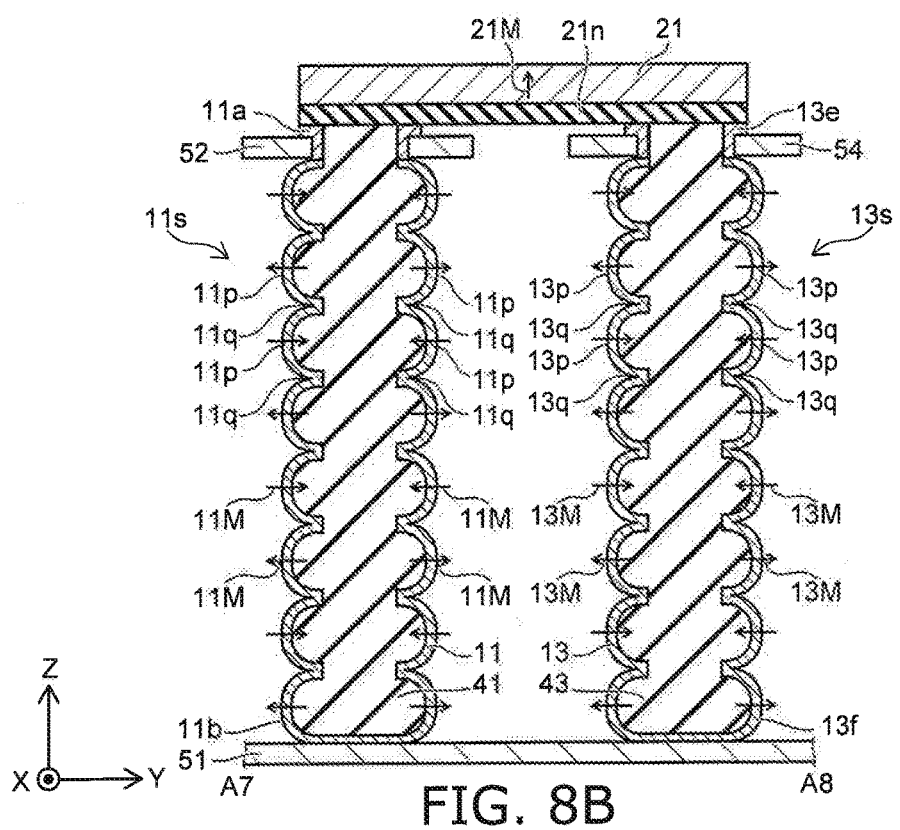

FIG. 8A and FIG. 8B are schematic cross-sectional views illustrating the magnetic memory device according to the second embodiment.

FIG. 8A is a line A5-A6 cross-sectional view of FIG. 7. FIG. 8B is a line A7-A8 cross-sectional view of FIG. 7.

The magnetic memory device 210 illustrated in FIG. 7 includes interconnects 94a, 94b, and 94c. The second electrode 52 is electrically connected to the interconnect 94a. The third electrode 53 is electrically connected to the interconnect 94b. The fourth electrode 54 is electrically connected to the interconnect 94c.

As illustrated in FIG. 7, FIG. 8A, and FIG. 8B, the first nonmagnetic layer 21n is provided between the first magnetic layer 21 and the first magnetic part 11a, between the first magnetic layer 21 and the third magnetic part 12c, and between the first magnetic layer 21 and the fifth magnetic part 13e in the Z-axis direction. The first magnetic layer 21 is electrically connected to an interconnect 95.

FIG. 9A, FIG. 9B, FIG. 10A, FIG. 10B, and FIG. 11 are schematic views illustrating the magnetic memory device according to the second embodiment.

The potential of the interconnect 93 is taken as the potential V1. The potential of the interconnect 94a is taken as a potential V2a. The potential of the interconnect 94b is taken as a potential V2b. The potential of the interconnect 94c is taken as a potential V2c. The potential of the interconnect 95 is taken as a potential V3. The potential V1 is, for example, the ground potential.

Figure 9A:
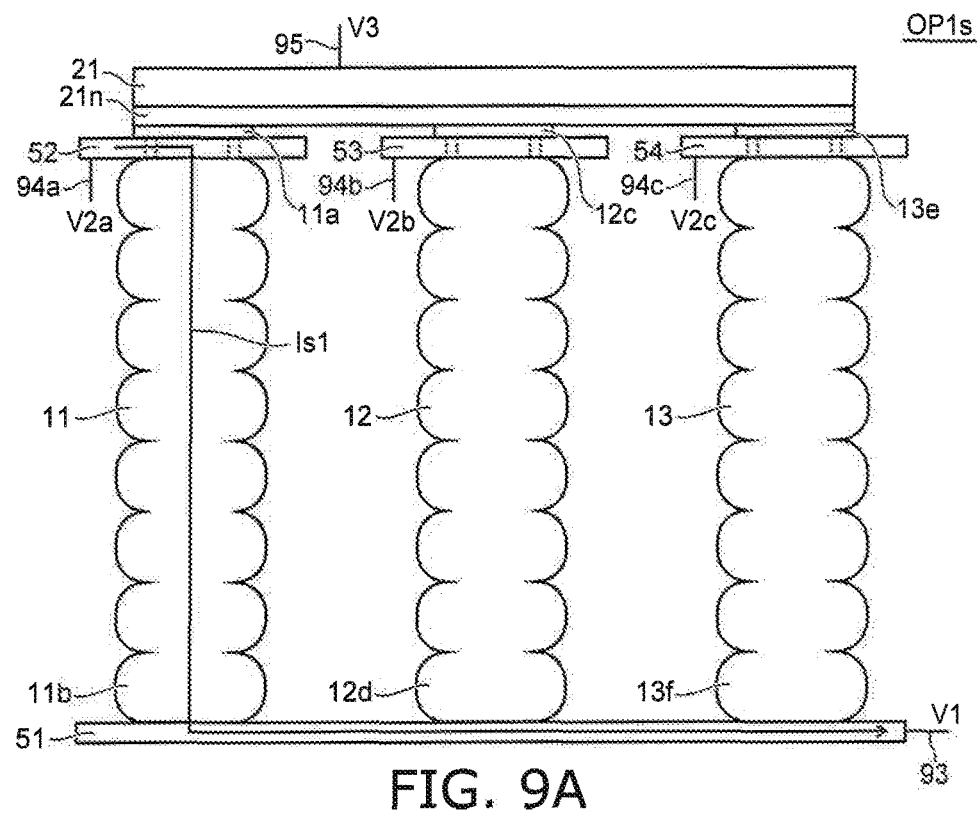
FIG. 9A, FIG. 9B, FIG. 10A, FIG. 10B, and FIG. 11 are schematic views illustrating the magnetic memory device according to the second embodiment.
Figure 9B:
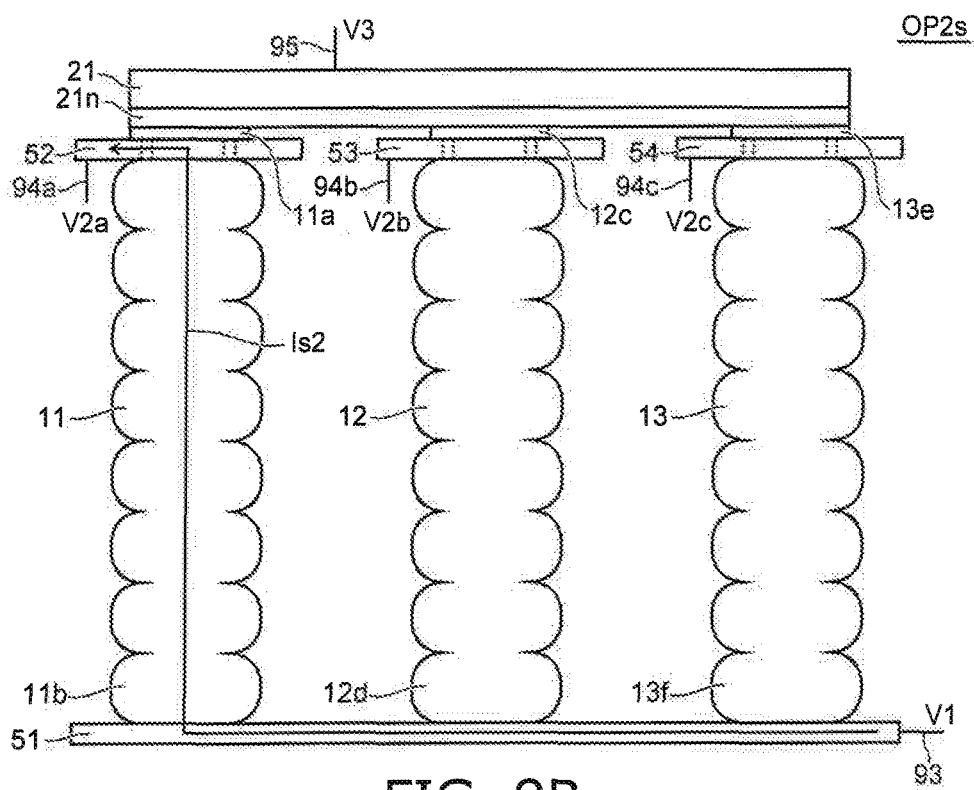

As illustrated in FIG. 9A and FIG. 9B, the controller 90 performs the first shift operation OP1s and the second shift operation OP2s.

In the first shift operation OP1s, the controller 90 sets one of the potential V2a, the potential V2b, or the potential V2c to be higher than the potential V1. For example, the controller 90 sets the potential V2a to be higher than the potential V1. For example, the controller 90 sets the difference between the potential V2a and the potential V1 to be larger than the difference between the potential V2b and the potential V1 and larger than the difference between the potential V2c and the potential V1. Thereby, as illustrated in FIG. 9A, the current Is1 that flows through the first magnetic portion 11 is supplied from the second electrode 52 toward the first electrode 51. Thereby, the multiple magnetic domains that are included in the first magnetic portion 11 are moved.

In the second shift operation OP2s, the controller 90 sets one of the potential V2a, the potential V2b, or the potential V2c to be lower than the potential V1. For example, the controller 90 sets the potential V2a to be lower than the potential V1. Thereby, as illustrated in FIG. 9B, the current Is2 that flows through the first magnetic portion 11 is supplied from the first electrode 51 toward the second electrode 52. Thereby, the multiple magnetic domains that are included in the first magnetic portion 11 are moved.

When moving the multiple magnetic domains included in the second magnetic portion 12, the controller 90 sets the potential V2b to be higher or lower than the potential V1. When moving the multiple magnetic domains included in the third magnetic portion 13, the controller 90 sets the potential V2c to be higher or lower than the potential V1.

Figure 10A:
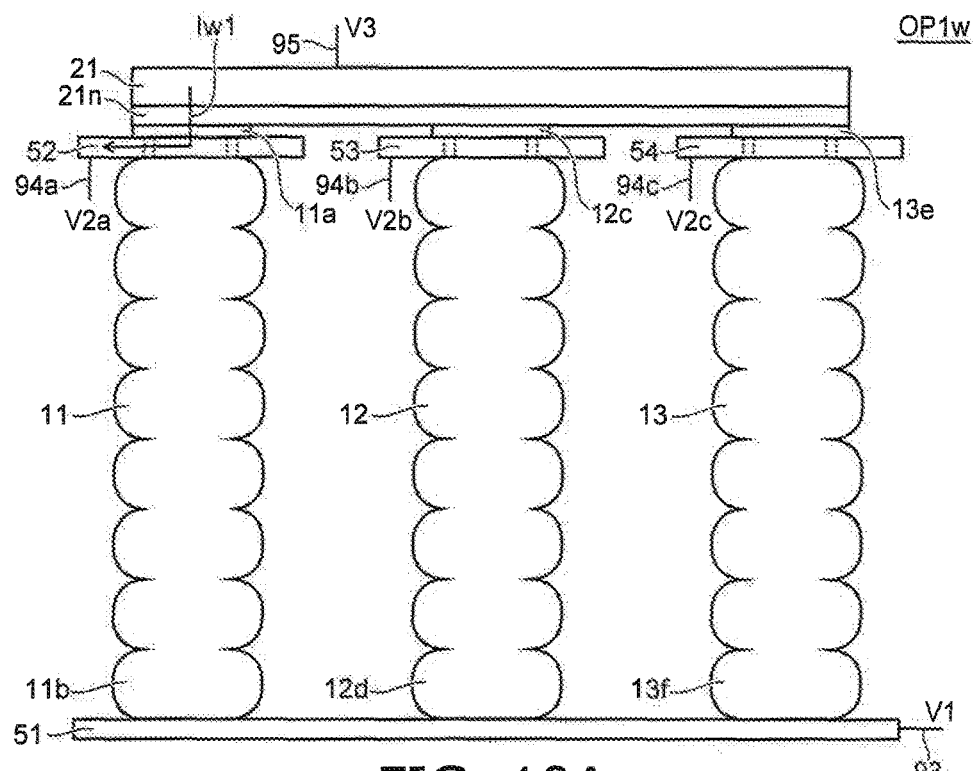
Figure 10B:
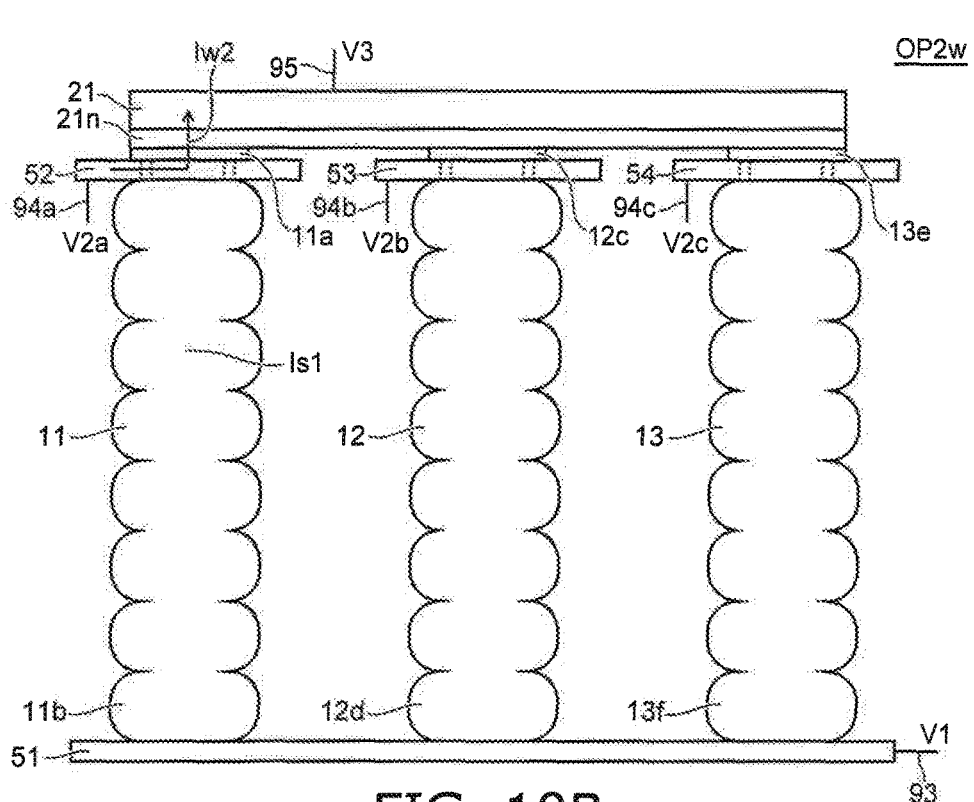

As illustrated in FIG. 10A and FIG. 10B, the controller 90 performs the first write operation OP1w and the second write operation OP2w.

For example, in the first write operation OP1w, the controller 90 sets one of the potential V2a, the potential V2b, or the potential V2c to be lower than the potential V3. For example, the controller 90 sets the potential V2a to be lower than the potential V3. For example, the controller 90 sets the difference between the potential V2a and the potential V1 to be larger than the difference between the potential V2b and the potential V1 and larger than the difference between the potential V2c and the potential V1. Thereby, as illustrated in FIG. 10A, the current Iw1 that flows from the first magnetic layer 21 toward the second electrode 52 is supplied. For example, the orientation of the magnetization of the first magnetic part 11a after performing the first write operation OP1w is aligned with the orientation of the magnetization of the first magnetic layer 21.

For example, in the second write operation OP2w, the controller 90 sets one of the potential V2a, the potential V2b, or the potential V2c to be higher than the potential V3. For example, the controller 90 sets the potential V2a to be higher than the potential V3. Thereby, as illustrated in FIG. 10B, the current Iw2 that flows from the second electrode 52 toward the first magnetic layer 21 is supplied. For example, after performing the second write operation OP2w, the orientation of the magnetization of the first magnetic part 11a is aligned with the reverse orientation of the orientation of the magnetization of the first magnetic layer 21.

In the example recited above, for example, the potential V2b and the potential V2c are floating in the first write operation OP1w and the second write operation OP2w.

Figure 11:
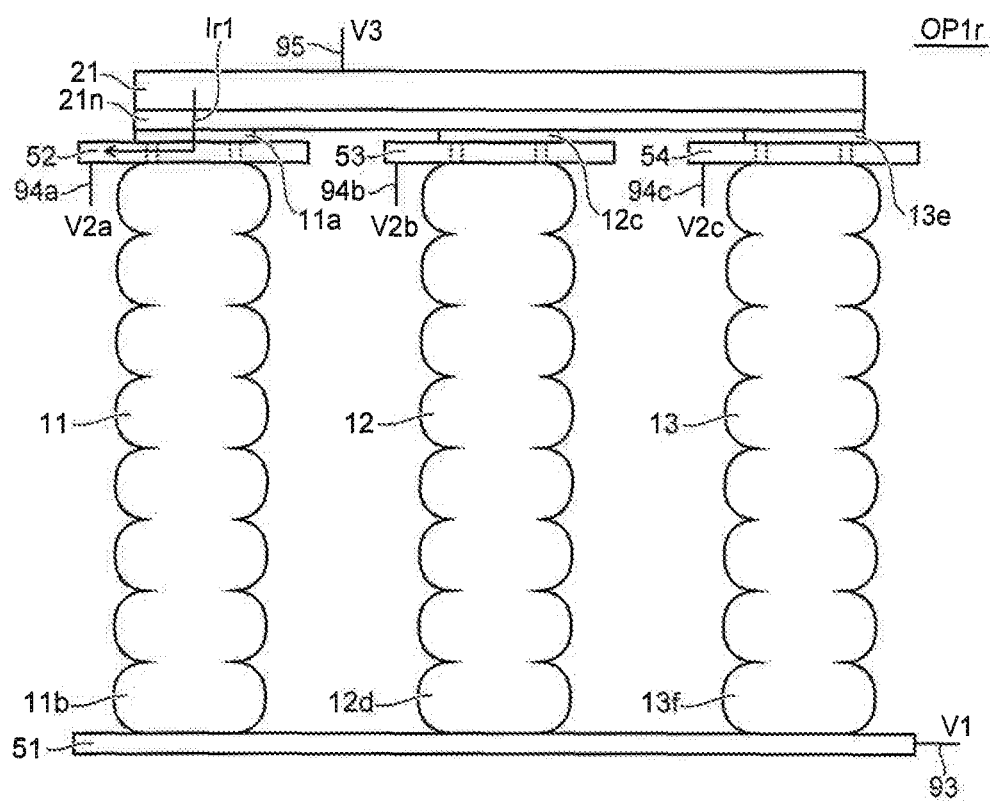

As illustrated in FIG. 11, the controller 90 performs the read operation OP1r.

For example, in the read operation OP1r, the controller 90 sets one of the potential V2a, the potential V2b, or the potential V2c to be lower than the potential V3. For example, the controller 90 sets the potential V2a to be lower than the potential V3. For example, the controller 90 sets the difference between the potential V2a and the potential V1 to be larger than the difference between the potential V2b and the potential V1 and larger than the difference between the potential V2c and the potential V1. Thereby, as illustrated in FIG. 11, the current Ir1 is supplied from the first magnetic layer 21 toward the second electrode 52. The controller 90 reads the magnetization information of the magnetic part to which the current Ir1 is supplied.

Figure 12:
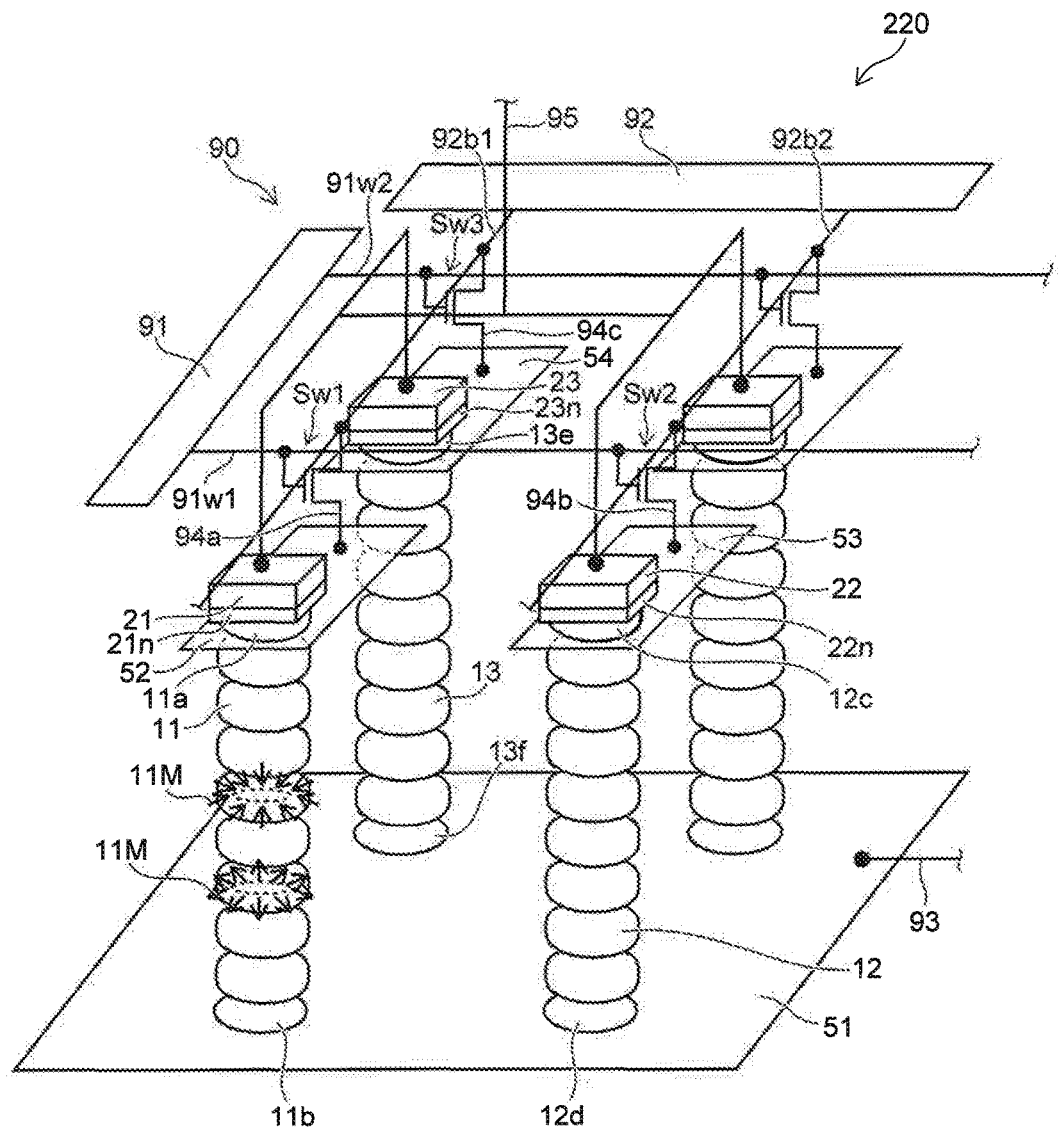
FIG. 12 is a perspective view illustrating another magnetic memory device according to the second embodiment.

FIG. 12 is a perspective view illustrating another magnetic memory device according to the second embodiment.

In the magnetic memory device 220 illustrated in FIG. 12, the first magnetic layer 21, the second magnetic layer 22, and the third magnetic layer 23 are electrically connected to the interconnect 95. The first magnetic layer 21, the second magnetic layer 22, and the third magnetic layer 23 are electrically connected to each other. For example, the potential of the first magnetic layer 21 is the same as the potential of the second magnetic layer 22 and the same as the potential of the third magnetic layer 23.

Similarly to the operations of the magnetic memory device 210 illustrated in FIG. 9A, FIG. 9B, FIG. 10A, FIG. 10B, and FIG. 11, the magnetic memory device 220 can perform the first shift operation OP1s, the second shift operation OP2s, the first write operation OP1w, the second write operation OP2w, and the read operation OP1r.

Figure 13:
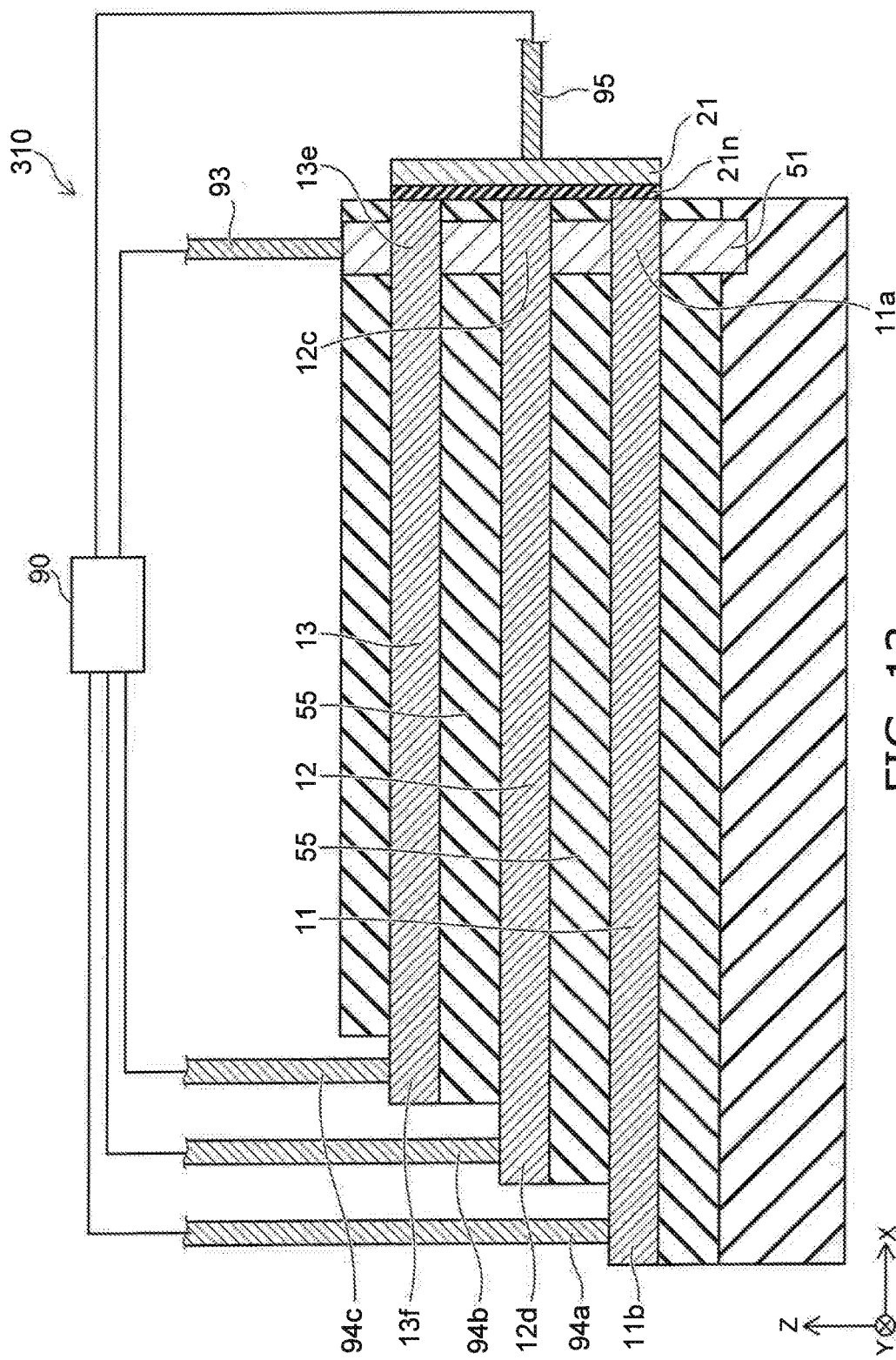
FIG. 13 is a schematic cross-sectional view illustrating a magnetic memory device according to a third embodiment.

FIG. 13 is a schematic cross-sectional view illustrating a magnetic memory device according to a third embodiment.

The magnetic memory device 310 illustrated in FIG. 13 includes the first magnetic portion 11, the second magnetic portion 12, the third magnetic portion 13, the first magnetic layer 21, the first nonmagnetic layer 21n, and the controller 90.

The first magnetic portion 11 includes the first magnetic part 11a and the second magnetic part 11b. The second magnetic portion 12 includes the third magnetic part 12c and the fourth magnetic part 12d. The third magnetic portion 13 includes the fifth magnetic part 13e and the sixth magnetic part 13f. For example, the second magnetic portion 12 is provided between the first magnetic portion 11 and the third magnetic portion 13 in the second direction crossing the first direction from the second magnetic part 11b toward the first magnetic part 11a. In the example, for example, the first direction is aligned with the X-axis direction illustrated in FIG. 13. For example, the second direction is aligned with the Z-axis direction illustrated in FIG. 13.

The first nonmagnetic layer 21n is provided between the first magnetic layer 21 and the first magnetic part 11a, between the first magnetic layer 21 and the third magnetic part 12c, and between the first magnetic layer 21 and the fifth magnetic part 13e in the X-axis direction.

The first electrode 51 is electrically connected to the first magnetic part 11a, the third magnetic part 12c, and the fifth magnetic part 13e. The first electrode 51 is electrically connected to the interconnect 93. The second magnetic part 11b is electrically connected to the interconnect 94a. The fourth magnetic part 12d is electrically connected to the interconnect 94b. The sixth magnetic part 13f is electrically connected to the interconnect 94c. The first magnetic layer 21 is electrically connected to the interconnect 95. The controller 90 is electrically connected to the interconnect 93, the interconnects 94a to 94c, and the interconnect 95.

FIG. 14A, FIG. 14B, FIG. 15A, FIG. 15B, and FIG. 16 are schematic views illustrating operations of the magnetic memory device according to the third embodiment.

The potential of the interconnect 93 is taken as the potential V1. The potential of the interconnect 94a is taken as the potential V2a. The potential of the interconnect 94b is taken as the potential V2b. The potential of the interconnect 94c is taken as the potential V2c. The potential of the interconnect 95 is taken as the potential V3. The potential V1 is, for example, the ground potential.

Figure 14A:
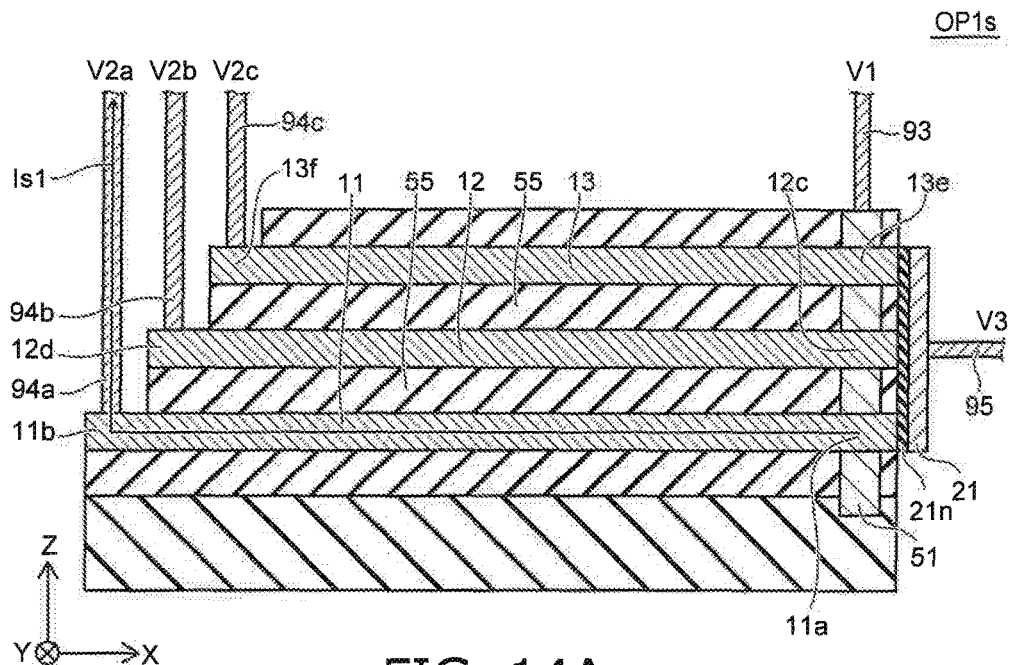
FIG. 14A, FIG. 14B, FIG. 15A, FIG. 15B, and FIG. 16 are schematic views illustrating operations of the magnetic memory device according to the third embodiment.
Figure 14B:
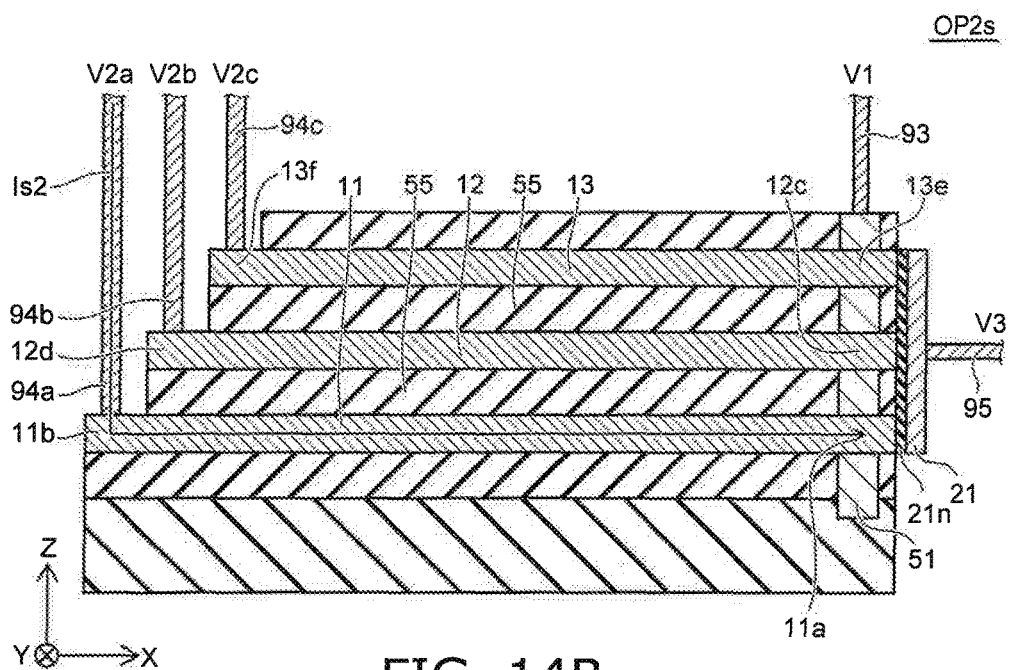

As illustrated in FIG. 14A and FIG. 14B, the controller 90 performs the first shift operation OP1s and the second shift operation OP2s.

In the first shift operation OP1s, the controller 90 sets one of the potential V2a, the potential V2b, or the potential V2c to be higher than the potential V1. For example, the controller 90 sets the potential V2a to be higher than the potential V1. The difference between the potential V2a and the potential V1 is larger than the difference between the potential V2b and the potential V1 and larger than the difference between the potential V2c and the potential V1. Thereby, as illustrated in FIG. 14A, the current Is1 that flows through the first magnetic portion 11 is supplied from the first electrode 51 toward the interconnect 94a. Thereby, the multiple magnetic domains that are included in the first magnetic portion 11 are moved.

In the second shift operation OP2s, the controller 90 sets one of the potential V2a, the potential V2b, or the potential V2c to be lower than the potential V1. For example, the controller 90 sets the potential V2a to be lower than the potential V1. The difference between the potential V2a and the potential V1 is larger than the difference between the potential V2b and the potential V1 and larger than the difference between the potential V2c and the potential V1. Thereby, as illustrated in FIG. 14B, the current Is2 that flows through the first magnetic portion 11 is supplied from the interconnect 94a toward the first electrode 51. Thereby, the multiple magnetic domains that are included in the first magnetic portion 11 are moved. The orientation in which the multiple magnetic domains move in the second shift operation OP2s is the reverse of the orientation in which the multiple magnetic domains move in the first shift operation OP1s.

When moving the multiple magnetic domains included in the second magnetic portion 12, the controller 90 sets the potential V2b to be higher or lower than the potential V1. When moving the multiple magnetic domains included in the third magnetic portion 13, the controller 90 sets the potential V2c to be higher or lower than the potential V1.

Figure 15A:
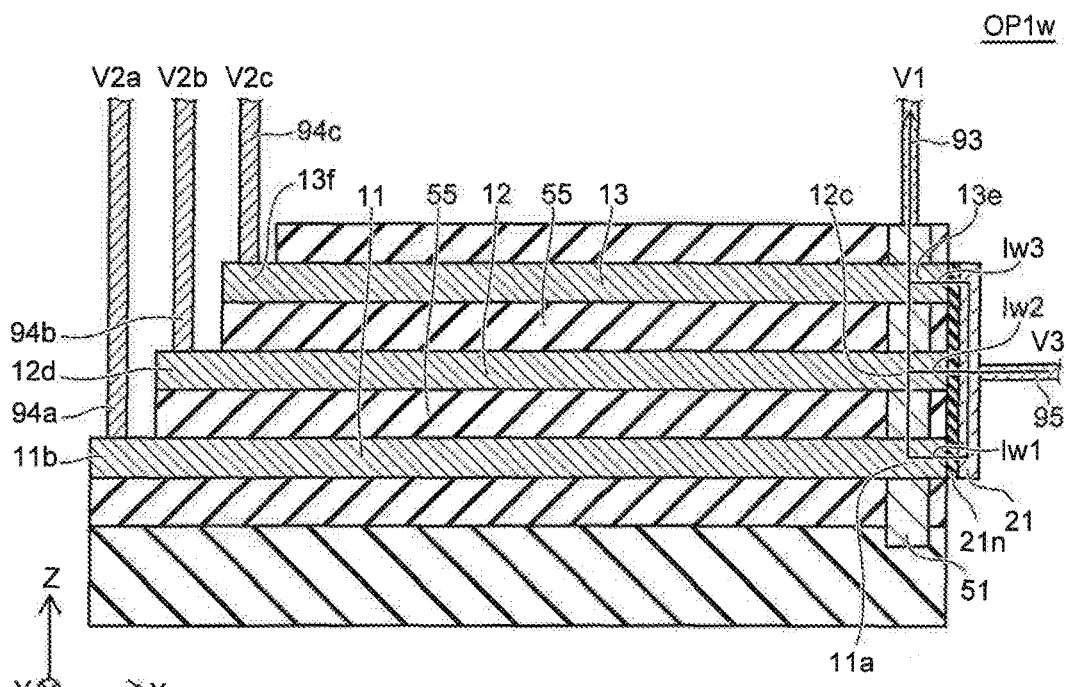
Figure 15B:
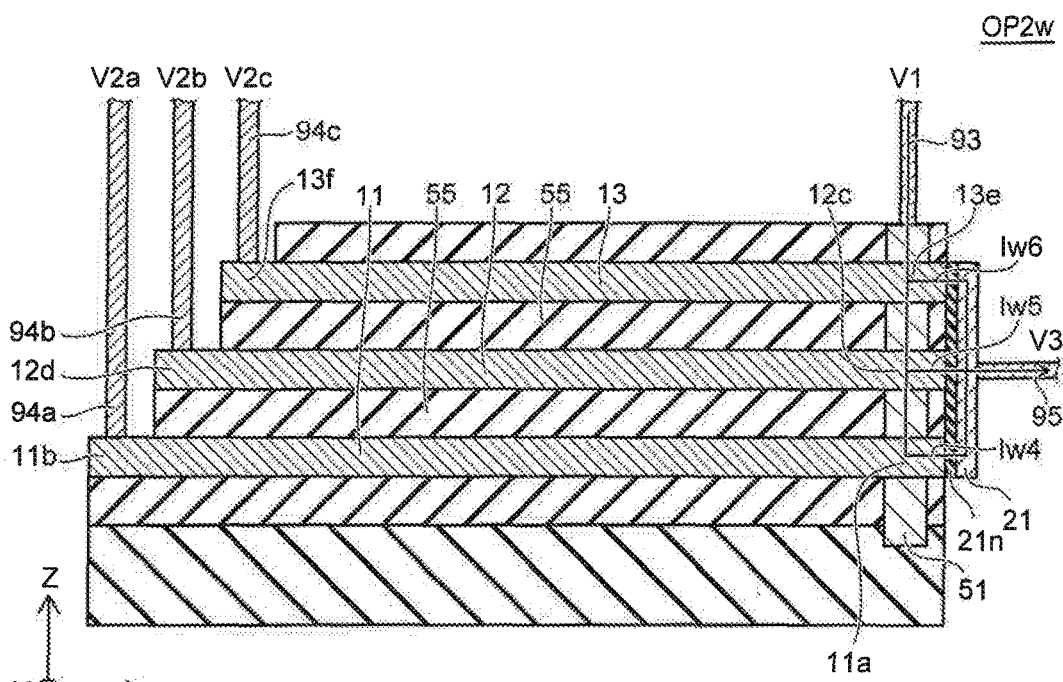

As illustrated in FIG. 15A and FIG. 15B, the controller 90 performs the first write operation OP1w and the second write operation OP2w.

For example, in the first write operation OP1w, the controller 90 sets the potential V1 to be lower than the potential V3. For example, the difference between the potential V1 and the potential V3 is larger than the difference between the potential V1 and the potential V2a and larger than the difference between the potential V3 and the potential V2a. Thereby, as illustrated in FIG. 15A, the current flows from the interconnect 95 toward the interconnect 93. The current Iw1 is supplied to the first magnetic part 11a; the current Iw2 is supplied to the third magnetic part 12c; and a current Iw3 is supplied to the fifth magnetic part 13e. For example, after performing the first write operation OP1w, the orientation of the magnetization of the first magnetic part 11a, the orientation of the magnetization of the third magnetic part 12c, and the orientation of the magnetization of the fifth magnetic part 13e are aligned with the orientation of the magnetization of the first magnetic layer 21.

For example, in the second write operation OP2w, the controller 90 sets the potential V1 to be higher than the potential V3. For example, the difference between the potential V1 and the potential V3 is larger than the difference between the potential V1 and the potential V2a and larger than the difference between the potential V3 and the potential V2a. Thereby, as illustrated in FIG. 15B, a current flows from the interconnect 93 toward the interconnect 95. A current Iw4 is supplied to the first magnetic part 11a; a current Iw5 is supplied to the third magnetic part 12c; and a current Iw6 is supplied to the fifth magnetic part 13e. For example, after performing the second write operation OP2w, the orientation of the magnetization of the first magnetic part 11a, the orientation of the magnetization of the third magnetic part 12c, and the orientation of the magnetization of the fifth magnetic part 13e are aligned with the reverse orientation of the orientation of the magnetization of the first magnetic layer 21. The orientation of the magnetization of the first magnetic part 11a after performing the second write operation OP2w is the reverse of the orientation of the magnetization of the first magnetic part 11a after performing the first write operation OP1w. The orientation of the magnetization of the third magnetic part 12c after performing the second write operation OP2w is the reverse of the orientation of the magnetization of the third magnetic part 12c after performing the first write operation OP1w. The orientation of the magnetization of the fifth magnetic part 13e after performing the second write operation OP2w, is the reverse of the orientation of the magnetization of the fifth magnetic part 13e after performing the first write operation OP1w.

In the example recited above, for example, the potential V2a, the potential V2b, and the potential V2c are floating in the first write operation OP1w and the second write operation OP2w.

Figure 16:
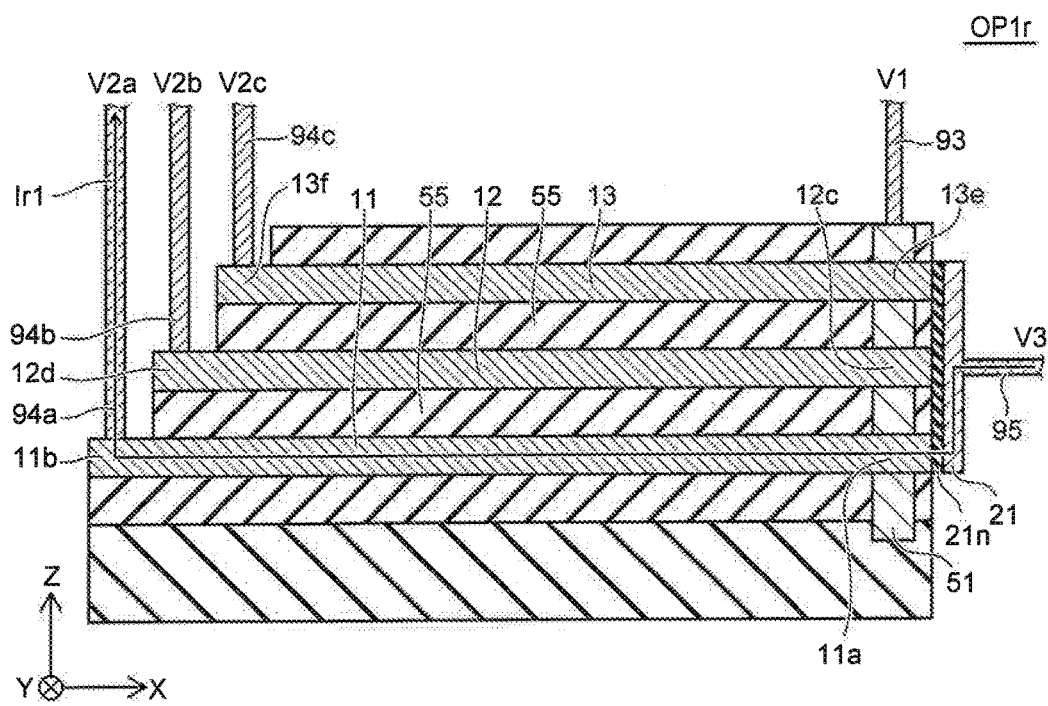

As illustrated in FIG. 16, the controller 90 performs the read operation OP1r.

For example, in the read operation OP1r, the controller 90 sets one of the potential V2a, the potential V2b, or the potential V2c to be lower than the potential V3. For example, the controller 90 sets the potential V2a to be lower than the potential V3. Thereby, as illustrated in FIG. 16, the current Ir1 is supplied from the interconnect 95 toward the interconnect 94a. The controller 90 reads the magnetization information of the first magnetic part 11a to which the current Ir1 is supplied. The difference between the potential V2a and the potential V3 in the read operation OP1r is smaller than the difference between the potential V1 and the potential V3 in the first write operation OP1w or the second write operation OP2w. Thereby, in the read operation OP1r, the writing of the magnetization information to the magnetic part can be suppressed.

The embodiments may include the following configurations (e.g., technological proposals).

Configuration 1

A magnetic memory device, comprising:
a first magnetic portion including a first magnetic part and a second magnetic part;
a first magnetic layer;
a first nonmagnetic layer provided between the first magnetic layer and the first magnetic part;
a second magnetic portion including a third magnetic part and a fourth magnetic part;
a second magnetic layer;
a second nonmagnetic layer provided between the second magnetic layer and the third magnetic part;
a first electrode electrically connected to the second magnetic part and the fourth magnetic part; and
a second electrode electrically connected to the first magnetic part and the third magnetic part.

Configuration 2

The magnetic memory device according to Configuration 1, further comprising:
a first interconnect electrically connected to the first electrode;
a second interconnect electrically connected to the second electrode; and
a controller performing a first operation,
in the first operation, the controller setting a potential of the second interconnect to be higher than a potential of the first interconnect.

Configuration 3

The magnetic memory device according to Configuration 2, wherein a first current and a second current are supplied from the second electrode toward the first electrode in the first operation, the first current flowing through the first magnetic portion, the second current flowing through the second magnetic portion.

Configuration 4

The magnetic memory device according to any one of Configurations 1 to 3, further comprising:
a third magnetic portion including a fifth magnetic part and a sixth magnetic part;
a third magnetic layer; and
a third nonmagnetic layer provided between the third magnetic layer and the fifth magnetic part,
a direction from the first magnetic portion toward the second magnetic portion crossing a direction from the first magnetic portion toward the third magnetic portion,
the first electrode being further electrically connected to the sixth magnetic part,
the second electrode being further electrically connected to the fifth magnetic part.

Configuration 5

A magnetic memory device, comprising:
a first magnetic portion including a first magnetic part and a second magnetic part;
a first magnetic layer;
a first nonmagnetic layer provided between the first magnetic layer and the first magnetic part;
a second magnetic portion including a third magnetic part and a fourth magnetic part;
a second magnetic layer;
a second nonmagnetic layer provided between the second magnetic layer and the third magnetic part;
a first electrode electrically connected to the second magnetic part and the fourth magnetic part;
a second electrode electrically connected to the first magnetic part; and
a third electrode electrically connected to the third magnetic part and the second electrode.

Configuration 6

The magnetic memory device according to Configuration 5, further comprising:
a first interconnect electrically connected to the first electrode;
a second interconnect electrically connected to the second electrode and the third electrode; and
a controller performing a first operation,
in the first operation, the controller setting a potential of the second interconnect to be higher than a potential of the first interconnect.

Configuration 7

The magnetic memory device according to Configuration 6, wherein in the first operation, a potential of the second electrode is set to a first potential, and a potential of the third electrode is set to the first potential.

Configuration 8

The magnetic memory device according to Configuration 6 or 7, wherein in the first operation, a first current flowing through the first magnetic portion is supplied from the second electrode toward the first electrode, and a second current flowing through the second magnetic portion is supplied from the second electrode toward the first electrode.

Configuration 9

The magnetic memory device according to any one of Configurations 5 to 8, further comprising:
a third magnetic portion including a fifth magnetic part and a sixth magnetic part;
a third magnetic layer;
a third nonmagnetic layer provided between the third magnetic layer and the fifth magnetic part; and
a fourth electrode,
a direction from the first magnetic portion toward the second magnetic portion crossing a direction from the first magnetic portion toward the third magnetic portion,
the first electrode being further electrically connected to the sixth magnetic part,
the fourth electrode being electrically connected to the fifth magnetic part, the second electrode, and the third electrode.

Configuration 10

A magnetic memory device, comprising:
a first magnetic portion including a first magnetic part and a second magnetic part;
a second magnetic portion including a third magnetic part and a fourth magnetic part;
a first magnetic layer;
a first nonmagnetic layer provided between the first magnetic layer and the first magnetic part and between the first magnetic layer and the third magnetic part;
a first electrode electrically connected to the second magnetic part and the fourth magnetic part;
a second electrode electrically connected to the first magnetic part; and
a third electrode electrically connected to the third magnetic part.

Configuration 11

The magnetic memory device according to Configuration 9, further comprising:
a first interconnect electrically connected to the first magnetic layer;
a second interconnect electrically connected to the second, electrode;

a third interconnect electrically connected to the third electrode; and a controller performing a first operation, in the first operation, the controller setting a potential difference between the first interconnect and the second interconnect to be larger than a potential difference between the first interconnect and the third interconnect.

Configuration 12

The magnetic memory device according to Configuration 10 or 11, further comprising:

a third magnetic portion including a fifth magnetic part and a sixth magnetic part; and a fourth electrode, a direction from the first magnetic portion toward the second magnetic portion crossing a direction from the first magnetic portion toward the third magnetic portion, a portion of the first nonmagnetic layer being provided between the fifth magnetic part and the first magnetic layer, the first electrode being further electrically connected to the sixth magnetic part, the fourth electrode being electrically connected to the fifth magnetic part.

Configuration 13

A magnetic memory device, comprising:

a first magnetic portion including a first magnetic part and a second magnetic part;

a first magnetic layer;

a first nonmagnetic layer provided between the first magnetic layer and the first magnetic part;

a second magnetic portion including a third magnetic part and a fourth magnetic part;

a second magnetic layer electrically connected to the first magnetic layer;

a second nonmagnetic layer provided between the second magnetic layer and the third magnetic part;

a first electrode electrically connected to the second magnetic part and the fourth magnetic part;

a second electrode electrically connected to the first magnetic part; and a third electrode electrically connected to the third magnetic part.

Configuration 14

The magnetic memory device according to Configuration 13, further comprising:

a first interconnect electrically connected to the first magnetic layer and the second magnetic layer;

a second interconnect electrically connected to the second electrode;

a third interconnect electrically connected to the third electrode; and a controller performing a first operation, in the first operation, the controller setting a potential difference between the first interconnect and the second interconnect to be larger than a potential difference between the first interconnect and the third interconnect.

Configuration 15

The magnetic memory device according to Configuration 14, wherein in the first operation, a potential of the first magnetic layer is set to a first potential, and a potential of the second magnetic layer is set to the first potential.

Configuration 16

The magnetic memory device according to any one of Configurations 13 to 15, further comprising:

a third magnetic portion including a fifth magnetic part and a sixth magnetic part;

a third magnetic layer electrically connected to the first magnetic layer and the second magnetic layer;

a third nonmagnetic layer provided between the third magnetic layer and the fifth magnetic part; and a fourth electrode, a direction from the first magnetic portion toward the second magnetic portion crossing a direction from the first magnetic portion toward the third magnetic portion, the first electrode being further electrically connected to the sixth magnetic part, the fourth electrode being electrically connected to the fifth magnetic part.

Configuration 17

A magnetic memory device, comprising:

a first magnetic portion including a first magnetic part and a second magnetic part;

a first magnetic layer;

a first nonmagnetic layer provided between the first magnetic layer and the first magnetic part;

a second magnetic portion including a third magnetic part and a fourth magnetic part;

a second magnetic layer electrically connected to the first magnetic layer;

a second nonmagnetic layer provided between the second magnetic layer and the third magnetic part;

a first electrode electrically connected to the second magnetic part and the fourth magnetic part;

a second electrode electrically connected to the first magnetic part; and a third electrode electrically connected to the third magnetic part.

Configuration 18

The magnetic memory device according to Configuration 17, further comprising:

a first interconnect electrically connected to the first magnetic layer and the second magnetic layer;

a second interconnect electrically connected to the second electrode;

a third interconnect electrically connected to the third electrode; and a controller performing a first operation, in the first operation, the controller setting a potential difference between the first interconnect and the second interconnect to be larger than a potential difference between the first interconnect and the third interconnect.

Configuration 19

The magnetic memory device according to Configuration 18, wherein in the first operation, a potential of the first magnetic layer is set to a first potential, and a potential of the second magnetic layer is set to the first potential.

Configuration 20

The magnetic memory device according to any one of Configurations 1 to 19, further comprising a first insulating portion, the first magnetic portion being provided around the first insulating portion, a direction from the first insulating portion toward the first magnetic portion crossing a first direction from the first electrode toward the second electrode, the first magnetic portion having a first surface and a second surface, the second surface being positioned between the first insulating portion and the first surface, the first surface including multiple first top portions and multiple first bottom portions arranged alternately along the first direction.

According to the embodiments described above, a magnetic memory device that can be downsized can be provided.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, embodiments of the invention are described with reference to specific examples. However, the embodiments of the invention are not limited to these specific examples. For example, one skilled in the art may similarly practice the invention by appropriately selecting specific configurations of components included in the magnetic memory element such as the magnetic portion, the magnetic layer, the nonmagnetic layer, the insulating portion, the electrode, the controller, etc., from known art; and such practice is within the scope of the invention to the extent that similar effects can be obtained.

Any two or more components of the specific examples may be combined within the extent of technical feasibility and are within the scope of the invention to the extent that the spirit of the invention is included.

All magnetic memory devices practicable by an appropriate design modification by one skilled in the art based on the magnetic memory devices described above as the embodiments of the invention also are within the scope of the invention to the extent that the spirit of the invention is included.

Various modifications and alterations within the spirit of the invention will be readily apparent to those skilled in the art; and all such modifications and alterations should be seen as being within the scope of the invention.

Although several embodiments of the invention are described, these embodiments are presented as examples and are not intended to limit the scope of the invention. These novel embodiments may be implemented in other various forms; and various omissions, substitutions, and modifications can be performed without departing from the spirit of the invention. Such embodiments and their modifications are within the scope and spirit of the invention and are included in the invention described in the claims and their equivalents.

What is claimed is:

1. A magnetic memory device, comprising:
   a first magnetic portion including a magnetization, the first magnetic portion including a first magnetic part and a second magnetic part;
   a first magnetic layer;
   a first nonmagnetic layer provided between the first magnetic layer and the first magnetic part;
   a second magnetic portion including a third magnetic part and a fourth magnetic part;
   a second magnetic layer;
   a second nonmagnetic layer provided between the second magnetic layer and the third magnetic part;
   a first electrode electrically connected to the second magnetic part and the fourth magnetic part; and
   a second electrode electrically connected to the first magnetic part and the third magnetic part.

2. The device according to claim 1, further comprising:
   a first interconnect electrically connected to the first electrode;
   a second interconnect electrically connected to the second electrode; and
   a controller performing a first operation,
   in the first operation, the controller setting a potential of the second interconnect to be higher than a potential of the first interconnect.

3. The device according to claim 2, wherein a first current and a second current are supplied from the second electrode toward the first electrode in the first operation, the first current flowing through the first magnetic portion, the second current flowing through the second magnetic portion.

4. The device according to claim 1, further comprising a first insulating portion,
   the first magnetic portion being provided around the first insulating portion,
   a direction from the first insulating portion toward the first magnetic portion crossing a first direction from the first electrode toward the second electrode,
   the first magnetic portion having a first surface and a second surface, the second surface being positioned between the first insulating portion and the first surface,
   the first surface including a plurality of first top portions and a plurality of first bottom portions arranged alternately along the first direction.

5. A magnetic memory device, comprising:
   a first magnetic portion including a magnetization, the first magnetic portion including a first magnetic part and a second magnetic part;
   a first magnetic layer;
   a first nonmagnetic layer provided between the first magnetic layer and the first magnetic part;
   a second magnetic portion including a third magnetic part and a fourth magnetic part;
   a second magnetic layer;
   a second nonmagnetic layer provided between the second magnetic layer and the third magnetic part;
   a first electrode electrically connected to the second magnetic part and the fourth magnetic part;
   a second electrode electrically connected to the first magnetic part; and
   a third electrode electrically connected to the third magnetic part and the second electrode.

6. The device according to claim 5, further comprising:
   a first interconnect electrically connected to the first electrode;
   a second interconnect electrically connected to the second electrode and the third electrode; and
   a controller performing a first operation,
   in the first operation, the controller setting a potential of the second interconnect to be higher than a potential of the first interconnect.

7. The device according to claim 6, wherein in the first operation, a potential of the second electrode is set to a first potential, and a potential of the third electrode is set to the first potential.

8. The device according to claim 6, wherein in the first operation, a first current flowing through the first magnetic portion is supplied from the second electrode toward the first electrode, and a second current flowing through the second magnetic portion is supplied from the second electrode toward the first electrode.

9. The device according to claim 6, further comprising a first insulating portion,
   the first magnetic portion being provided around the first insulating portion,
   a direction from the first insulating portion toward the first magnetic portion crossing a first direction from the first electrode toward the second electrode,
   the first magnetic portion having a first surface and a second surface, the second surface being positioned between the first insulating portion and the first surface,
   the first surface including a plurality of first top portions and a plurality of first bottom portions arranged alternately along the first direction.

10. A magnetic memory device, comprising:
- a first magnetic portion including a magnetization, the first magnetic portion including a first magnetic part and a second magnetic part;
- a second magnetic portion including a third magnetic part and a fourth magnetic part;
- a first magnetic layer;
- a first nonmagnetic layer provided between the first magnetic layer and the first magnetic part and between the first magnetic layer and the third magnetic part;
- a first electrode electrically connected to the second magnetic part and the fourth magnetic part;
- a second electrode electrically connected to the first magnetic part; and
- a third electrode electrically connected to the third magnetic part.

11. The device according to claim 10, further comprising:
- a first interconnect electrically connected to the first magnetic layer;
- a second interconnect electrically connected to the second electrode;
- a third interconnect electrically connected to the third electrode; and
- a controller performing a first operation,
- in the first operation, the controller setting a potential difference between the first interconnect and the second interconnect to be larger than a potential difference between the first interconnect and the third interconnect.

12. The device according to claim 10, further comprising a first insulating portion,
- the first magnetic portion being provided around the first insulating portion,
- a direction from the first insulating portion toward the first magnetic portion crossing a first direction from the first electrode toward the second electrode,
- the first magnetic portion having a first surface and a second surface, the second surface being positioned between the first insulating portion and the first surface,
- the first surface including a plurality of first top portions and a plurality of first bottom portions arranged alternately along the first direction.

13. The device according to claim 1, wherein the first magnetic portion includes a rare earth-transition metal amorphous alloy.

14. The device according to claim 1, wherein the first magnetic portion includes at least one selected from the group consisting of a first multilayer film including a Co film and a Ni film, a second multilayer film including a Co film and a Pd film, and a third multilayer film including a Co film and a Pt film.

15. The device according to claim 1, wherein the first magnetic portion includes at least one selected from the group consisting of Fe, Co, and Ni.

16. The device according to claim 15, wherein the first magnetic portion further includes at least one selected from the group consisting of Pt and Pd.

17. The device according to claim 1, wherein the second magnetic portion includes a magnetization.

18. The device according to claim 1, wherein the first electrode and the second electrode connect the first magnetic portion and the second magnetic portion in parallel.

19. The device according to claim 5, wherein the first magnetic portion includes a rare earth-transition metal amorphous alloy.

20. The device according to claim 5, wherein the first magnetic portion includes at least one selected from the group consisting of a first multilayer film including a Co film and a Ni film, a second multilayer film including a Co film and a Pd film, and a third multilayer film including a Co film and a Pt film.

21. The device according to claim 5, wherein the first magnetic portion includes at least one selected from the group consisting of Fe, Co, and Ni.

22. The device according to claim 21, wherein the first magnetic portion further includes at least one selected from the group consisting of Pt and Pd.

23. The device according to claim 5, wherein the second magnetic portion includes a magnetization.

24. The device according to claim 5, wherein the first electrode and the second electrode connect the first magnetic portion and the second magnetic portion in parallel.

25. The device according to claim 10, wherein the first magnetic portion includes a rare earth-transition metal amorphous alloy.

26. The device according to claim 10, wherein the first magnetic portion includes at least one selected from the group consisting of a first multilayer film including a Co film and a Ni film, a second multilayer film including a Co film and a Pd film, and a third multilayer film including a Co film and a Pt film.

27. The device according to claim 10, wherein the first magnetic portion includes at least one selected from the group consisting of Fe, Co, and Ni.

28. The device according to claim 27, wherein the first magnetic portion further includes at least one selected from the group consisting of Pt and Pd.

29. The device according to claim 10, wherein the second magnetic portion includes a magnetization.

30. The device according to claim 10, wherein the first electrode and the second electrode connect the first magnetic portion and the second magnetic portion in parallel.

* * * * *